(12) United States Patent
Yeom et al.

(10) Patent No.: US 11,424,375 B2
(45) Date of Patent: Aug. 23, 2022

(54) PHOTOELECTRONIC DEVICE, PHOTODIODE, AND PHOTOTRANSISTOR

(71) Applicant: Research & Business Foundation Sungkyunkwan University, Suwon-si (KR)

(72) Inventors: Geun Young Yeom, Seoul (KR); Ki Seok Kim, Incheon (KR); Ki Hyun Kim, Daejeon (KR); You Jin Ji, Suwon-si (KR); Ji Young Byun, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/800,121

(22) Filed: Feb. 25, 2020

(65) Prior Publication Data
US 2020/0274010 A1   Aug. 27, 2020

(30) Foreign Application Priority Data
Feb. 25, 2019 (KR) .......................... 10-2019-0021745

(51) Int. Cl.
*H01L 31/032* (2006.01)
*H01L 31/113* (2006.01)
(Continued)

(52) U.S. Cl.
CPC .. *H01L 31/0324* (2013.01); *H01L 31/022408* (2013.01); *H01L 31/03529* (2013.01); *H01L 31/102* (2013.01); *H01L 31/1136* (2013.01)

(58) Field of Classification Search
CPC .......... H01L 31/0324; H01L 31/03529; H01L 31/102; H01L 31/1136; H01L 31/022408;
(Continued)

(56) References Cited

U.S. PATENT DOCUMENTS

2019/0044009 A1 *   2/2019   Yeom .................. H01L 31/0392

FOREIGN PATENT DOCUMENTS

KR          10-1853588 B1      4/2018
KR          101853588 B1 *     4/2018

OTHER PUBLICATIONS

Sarah L. Howell et al., "Investigation of Band-Offsets at Monolayer-Multilayer MoS2 Junctions by Scanning Photocurrent Microscopy", 2015 American Chemical Society, Nano Letters 2014 p. A-p. G.

* cited by examiner

Primary Examiner — Hoang-Quan Ho
(74) Attorney, Agent, or Firm — NSIP Law

(57) ABSTRACT

A photoelectronic device includes a substrate; a first electrode and a second electrode disposed on the substrate and spaced apart from each other in a first direction; and a transition metal dichalcogenide thin film including at least one first region and at least one second region. Each first region includes M+N transition metal dichalcogenide molecular layers and extends along the first direction. Each second region includes N transition metal dichalcogenide molecular layers extending from lower N transition metal dichalcogenide molecular layers of the first region. Each second region extends along the first direction and is adjacent to each first region. Both end regions in the first direction among the first and the second regions are electrically connected to the first electrode and the second electrode, respectively.

7 Claims, 34 Drawing Sheets

(51) Int. Cl.
*H01L 31/0224* (2006.01)
*H01L 31/0352* (2006.01)
*H01L 31/102* (2006.01)

(58) Field of Classification Search
CPC . H01L 31/1129; H01L 31/109; H01L 31/032; H01L 31/035281; H01L 31/036; H01L 31/022425; H01L 31/072; H01L 31/10; Y02E 10/50
See application file for complete search history.

PHOTOELECTRONIC DEVICE, PHOTODIODE, AND PHOTOTRANSISTOR

CROSS-REFERENCE TO RELATED APPLICATION

This application claims a benefit under 35 U.S.C. § 119(a) of Korean Patent Application No. 10-2019-0021745 filed on Feb. 25, 2019, on the Korean Intellectual Property Office, the entire disclosure of which is incorporated herein by reference for all purposes.

BACKGROUND

1. Field

The present disclosure relates to a photoelectronic device, a photodiode and a phototransistor. More specifically, the present disclosure relates to a photoelectronic device, a photodiode and a phototransistor including a transition metal dichalcogenide thin film having regions including different numbers of molecular layers.

2. Description of Related Art

Transition metal dichalcogenide (TMD) is a compound having a bond between a transition metal atom M and a chalcogen atom X. This TMD compound is a two-dimensional material with a layered structure in which molecular layers are bonded to each other via weak van der Waals force. $MoS_2$ as one of representative TMD compounds has an indirect band gap of 1.2 eV in a bulk state, while having a direct band gap of 1.9 eV in a monolayer state. That is, a film made of $MoS_2$ has different band gaps depending on a thickness thereof. A film made of each of TMD compounds other than $MoS_2$ has varying physical and chemical properties including the bandgap depending on the thickness thereof.

Attempts have been made to partially separate molecular layers made of the TMD compound from each other using the above properties of the TMD compounds. However, using a mechanical peeling method using a scotch tape, multi-junctions based on the TMD may not be formed. when the multi-junctions are formed using the mechanical peeling method, only heterojunction is formed by accident during the mechanical peeling process. However, heterojunction having a desired number of layers and a desired pattern may not be formed.

Therefore, there is a need for further research and development on a new scheme capable of controlling a TMD layer without damage thereto and forming a TMD film having different numbers of molecular layers at desired regions and having a desired thickness.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a photoelectronic device including a transition metal dichalcogenide thin film having regions having different numbers of molecular layers.

Another purpose of the present disclosure is to provide a photodiode including a transition metal dichalcogenide thin film with regions having different numbers of molecular layers.

Another purpose of the present disclosure is to provide a phototransistor including a transition metal dichalcogenide thin film with regions having different numbers of molecular layers.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

A first aspect of the present disclosure provides a photoelectronic device comprising: a substrate; a first electrode and a second electrode disposed on the substrate and spaced apart from each other in a first direction; and a transition metal dichalcogenide thin film including at least one first region and at least one second region, wherein each first region includes M+N transition metal dichalcogenide molecular layers and extends along the first direction, wherein each second region includes N transition metal dichalcogenide molecular layers extending from lower N transition metal dichalcogenide molecular layers of the first region, wherein each second region extends along the first direction and is adjacent to each first region, wherein both end regions in the first direction among the first and the second regions are electrically connected to the first electrode and the second electrode, respectively.

In one implementation of the photoelectronic device, the at least one first region includes a plurality of first regions, and the at least one second region includes a plurality of the second regions, wherein the first regions and the second region are alternately arranged with each other.

In one implementation of the photoelectronic device, the second region has a single molecular layer, and the first region has two or more molecular layers.

In one implementation of the photoelectronic device, a width of each of the first region and the second region is independently in a range of 1 nm inclusive to 100 μm inclusive.

In one implementation of the photoelectronic device, the transition metal dichalcogenide thin film further includes at least 10 heterojunctions formed at boundaries of the first regions and the second regions respectively.

In one implementation of the photoelectronic device, the transition metal dichalcogenide thin film further includes at least one third region, each third region having L transition metal dichalcogenide molecular layers, wherein L is smaller than M+N and is larger than N.

A second aspect of the present disclosure provides a photodiode comprising: a substrate; a first electrode and a second electrode disposed on the substrate and spaced apart from each other in a first direction; and a transition metal dichalcogenide thin film including at least one first region and at least one second region, wherein each first region includes M+N transition metal dichalcogenide molecular layers and extends along the first direction, wherein each second region includes N transition metal dichalcogenide molecular layers extending from lower N transition metal dichalcogenide molecular layers of the first region, wherein each second region extends along the first direction and is adjacent to each first region, wherein both end regions in the first direction among the first and the second regions are electrically connected to the first electrode and the second electrode, respectively, wherein a heterojunction is formed between each first region and each second region.

A third aspect of the present disclosure provides a phototransistor comprising: a substrate having a gate voltage applied thereto and having an insulating film on a surface thereof; source and drain electrodes disposed on the insulating film of the substrate and spaced apart from each other in a first direction; and a transition metal dichalcogenide thin film including at least one first region and at least one second region, wherein each first region includes M+N transition metal dichalcogenide molecular layers and extends along the first direction, wherein each second region includes N transition metal dichalcogenide molecular layers extending from lower N transition metal dichalcogenide molecular layers of the first region, wherein each second region extends along the first direction and is adjacent to each first region, wherein both end regions in the first direction among the first and the second regions are electrically connected to the source electrode and the drain electrode, respectively, wherein a heterojunction is formed between each first region and each second region.

Effects in accordance with the present disclosure may be as follows but may not be limited thereto.

In a photoelectronic device according to the present disclosure, the transition metal dichalcogenide thin film may include the plurality of regions having the different numbers of molecular layers and extending in a direction in which the first and second electrodes are spaced apart from each other. The hetero junctions may be defined between the regions. Thus, the photoelectronic device may exhibit excellent electrical and optical properties. Specifically, as the number of molecular layers of the film made of the transition metal dichalcogenide compound varies, the band gap of the film changes from 1.2 eV to 1.9 eV. At the same time, the band gap type is converted from an indirect transition type gap to a direct transition type gap. In the heterojunction portion formed by controlling the number of molecular layers, the difference between the electron affinities and the difference between work functions and formation of interlayer gap due to the different band gaps, and the built-in electric field created by the depletion region formed in the hetero-junction region may occur, thereby improving separation between electrons and holes in electron-hole pairs such that photoelectric properties such as photoresponsivity and photo-response time of the device may be improved. In accordance with the present disclosure, the number of heterojunctions having these characteristics may increase, thus to allow excellent photoelectric properties. Further, forming multi-hetero-junctions in a direction in which the source electrode and the drain electrode are spaced from each other, thereby to allow more excellent photoelectric properties.

In addition to the effects as described above, specific effects in accordance with the present disclosure will be described together with the detailed description for carrying out the disclosure.

DETAILED DESCRIPTIONS

Figure 1:
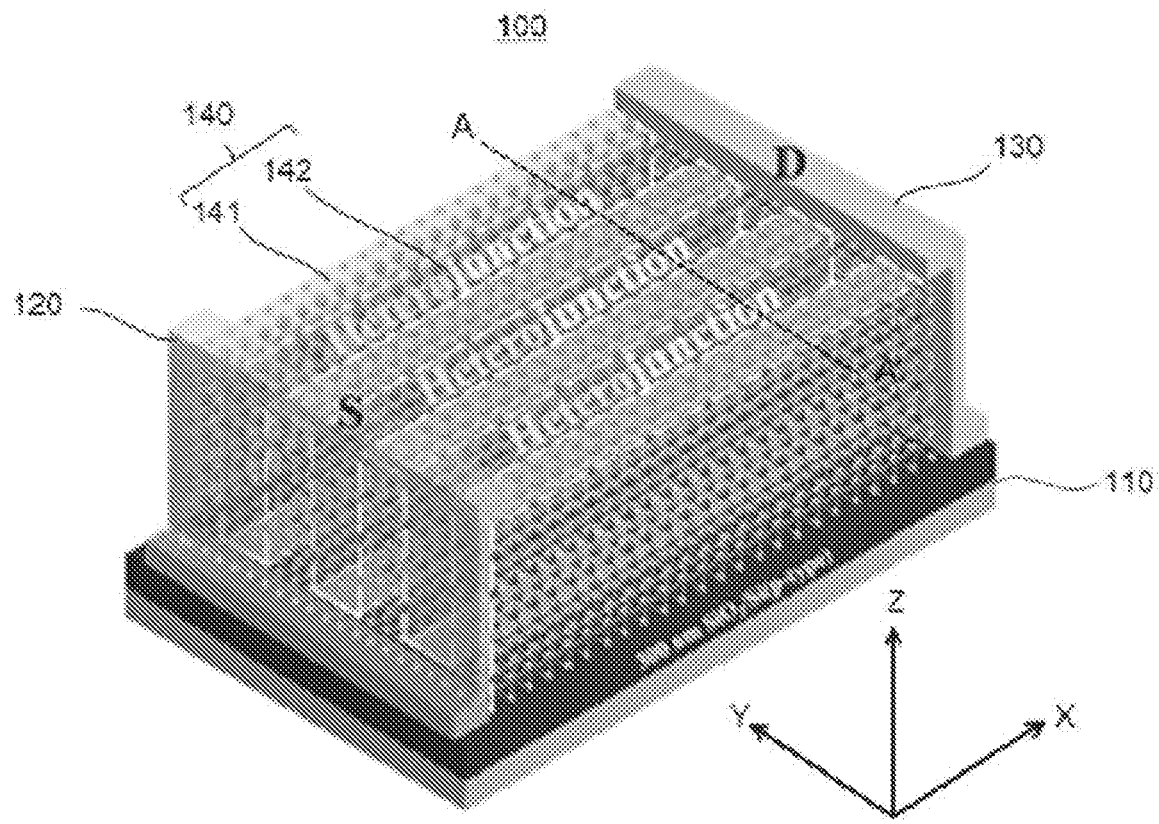
FIG. 1 is a perspective view for illustrating a photoelectronic device according to an embodiment of the present disclosure.

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
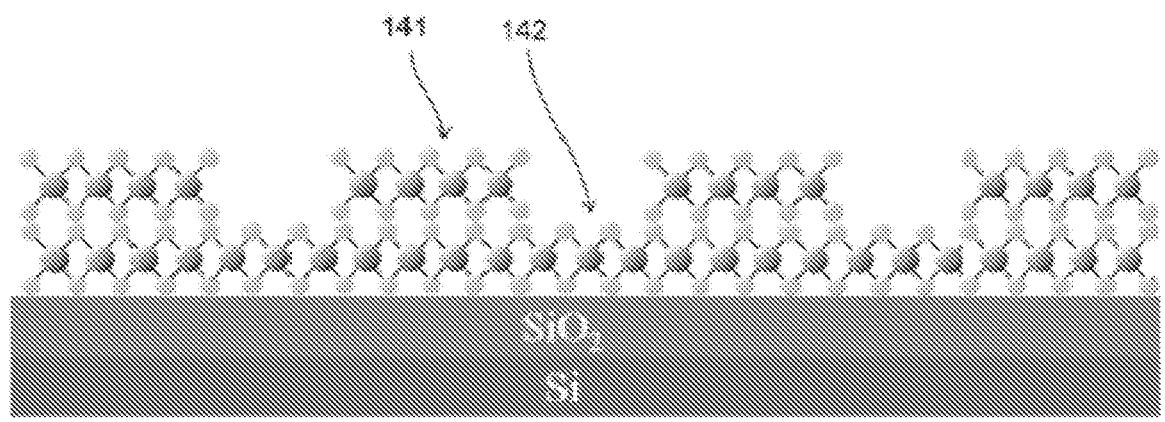
FIG. 2 is a cross-sectional view taken along a cut line A-A' illustrated in FIG. 1.

FIG. 1 is a perspective view for illustrating a photoelectronic device according to an embodiment of the present disclosure. FIG. 2 is a cross-sectional view taken along a cut line A-A' illustrated in FIG. 1.

Referring to FIG. 1 and FIG. 2, a photoelectronic device 100 according to an embodiment of the present disclosure includes a substrate 110, a first electrode 120, a second electrode 130, and a transition metal dichalcogenide (TMD) thin film 140.

The substrate 110 is not particularly limited as long as it may support the transition metal dichalcogenide thin film 140. For example, the substrate 110 may include a silicon substrate, a glass substrate, a polymer substrate, a metal oxide substrate, and the like.

The first electrode 120 and the second electrode 130 may be spaced apart from each other in a first direction X and may be disposed on the substrate 110. A material of each of the first electrode 120 and the second electrode 130 is not particularly limited as long as it is an electrically conductive material. The first electrode 120 and the second electrode 130 may be made of the same material and may be made of different materials. For example, each of the first electrode 120 and the second electrode 130 may be independently made of a metal material, a conductive polymer material, a conductive carbon material, a conductive oxide material, or the like. For example, each of the first electrode 120 and the second electrode 130 may have a gold/titanium (Au/Ti) stack structure.

The transition metal dichalcogenide thin film 140 may be made of a transition metal dichalcogenide compound formed by combining one transition metal atom M and two chalcogen atoms X. In one embodiment, the transition metal dichalcogenide compound of the transition metal dichalcogenide thin film 140 may include at least one transition metal atom selected from molybdenum (Mo), tungsten (W), tin (Sn), cadmium (Cd), and zinc (Zn), and at least one chalcogen atom selected from selenium (Se), sulfur (S), and tellurium (Te). For example, the transition metal dichalcogenide compound may include molybdenum disulfide $MoS_2$ in which a molybdenum (Mo) atom and a sulfur (S) atom are bonded to each other.

In one embodiment, the transition metal dichalcogenide thin film 140 may include a plurality of first regions 141 extending in the first direction X and spaced apart from each other along a second direction Y and a plurality of second regions 142 extending in the first direction X, each second region being disposed between adjacent two first regions 141. For example, the plurality of the second regions 142 may be alternated with the plurality of the first regions 141. In this connection, both end regions in the first direction X among the first regions 141 and the second regions 142 may be electrically connected to the first electrode 120 and the second electrode 130, respectively.

The number of molecular layers in each of the first regions 141 may be larger than the number of molecular layers in each of the second regions 142. For example, each first region 141 may be composed of N+M molecular layers, while each second region may be composed of N molecular layers. In this connection, each of N and M may be a positive integer of 1 or greater. The molecular layers of the second region 142 may extend from lower N molecular layers of the first region 141.

In one embodiment, each second region 142 may have a single molecular layer, while each first region 141 may include two or more molecular layers. When the second region is composed of a single molecular layer, the second region has a direct band gap characteristic to improve the performance of the photoelectronic device.

In one embodiment, each of a width of the first region 141 and a width of the second region 142 may independently be in a range of about 1 nm inclusive to 100 um inclusive.

In one example, the number of hetero junctions formed on the transition metal dichalcogenide thin film 140 is not particularly limited and may vary depending on performance of the device as required.

In one example, the transition metal dichalcogenide thin film 140 may be formed by removing M molecular layers from a portion corresponding to the second region of a transition metal dichalcogenide film composed of N+M molecular layers, using a dry or wet etching process using a mask, for example, an atomic layer etching process (ALE process).

Films are made of the same transition metal dichalcogenide compound, the films may have different bandgap, physical, optical and chemical properties based on the number of the molecular layers constituting each film. Thus, a heterojunction may be formed at a boundary between the first region 141 and the second region 142. Accordingly, the transition metal dichalcogenide thin film 140 may include a plurality of hetero-junctions. The hetero junction may exhibit photoelectric characteristics such as photocurrent and photoresponsivity as improved due to different band-gaps of the first region 141 and the second region 142, a difference between work functions thereof, and a difference between electron affinities thereof.

In the above embodiment, the transition metal dichalcogenide thin film 140 is described as including only the first region 141 and the second region 142. However, the present disclosure is not limited thereto. The transition metal dichalcogenide thin film 140 may further include one or more third regions (not shown), each region having the number of molecular layers different from that of each of the first and the second regions 141 and 142. The first to third regions may be arranged regularly or irregularly. In this case, a first hetero junction may be formed at a boundary region between the first region 141 and the second region 142. A second hetero junction may be formed at a boundary region between the first region 141 and the third region. A third hetero junction may be formed at a boundary region between the second region 142 and the third region. Furthermore, the transition metal dichalcogenide thin film 140 may include further regions having different number of molecular layers.

The photoelectronic device 140 in accordance with the present disclosure may include a photodetector, a photodiode, a phototransistor, and the like.

In a photoelectronic device according to the present disclosure, the transition metal dichalcogenide thin film 140 may include the plurality of regions having the different numbers of molecular layers and extending in a direction in which the first and second electrodes are spaced apart from each other. The hetero junctions may be defined between the regions. Thus, the photoelectronic device may exhibit excellent electrical and optical properties. Specifically, as the number of molecular layers of the film made of the transition metal dichalcogenide compound varies, the band gap of the film changes from 1.2 eV to 1.9 eV. At the same time, the band gap type is converted from an indirect transition type gap to a direct transition type gap. In the heterojunction portion formed by controlling the number of molecular layers, the difference between the electron affinities and the difference between work functions and formation of interlayer gap due to the different band gaps, and the built-in electric field created by the depletion region formed in the hetero-junction region may occur, thereby improving separation between electrons and holes in electron-hole pairs such that photoelectric properties such as photoresponsivity and photo-response time of the device may be improved. In accordance with the present disclosure, the number of heterojunctions having these characteristics may increase, thus to allow excellent photoelectric properties. Further, forming multi-hetero-junctions in a direction in which the source electrode and the drain electrode are spaced from each other, thereby to allow more excellent photoelectric properties.

Figure 3:
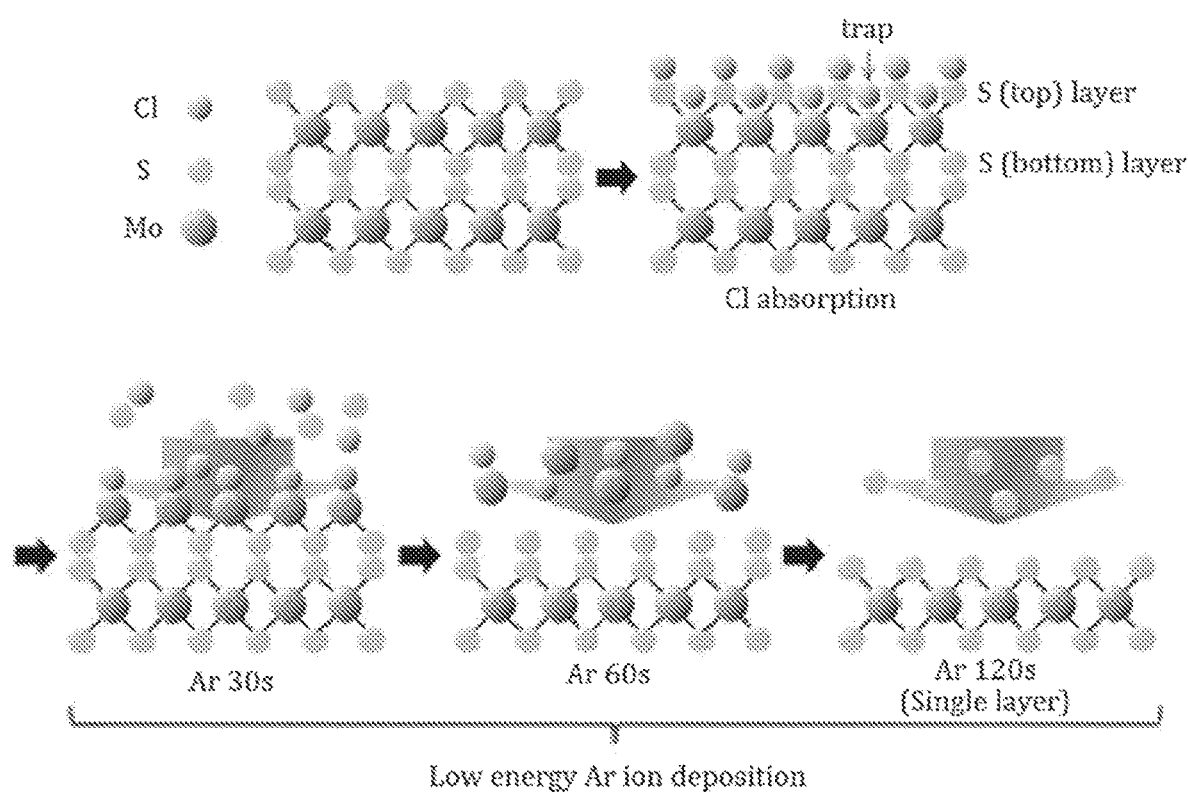
FIG. 3 is a view for illustrating a manufacturing method of a transition metal dichalcogenide thin film.

FIG. 3 is a view for illustrating a manufacturing method of a transition metal dichalcogenide thin film.

Referring to FIG. 3, a single $moS_2$ molecular layer has a structure in which an Mo atomic layer is disposed between a top S atomic layer and a bottom S atomic layer. A $MoS_2$ thin film has a structure in which a plurality of the single molecular layers are stacked vertically. In this connection, when exposing the $MoS_2$ thin film to radicals such as Cl and O, the radical Cl is adsorbed to the top S atom and is trapped between the top S layer and the Mo layer via van der Waals force (chemical absorption step). Next, when desorption process using a reactive compound such as Ar+ cation is executed, the adsorbed radical reacts with the top S atom such that binding energy of the top S atom is lowered. Thus, the top S atom may be first removed from a S—Cl crystal structure when being exposed to the reactive compound.

The trapped radical then reacts with Mo to form Mo—Cl, thereby weakening a bond between Mo and the bottom S. Thus, Mo is removed from the crystal structure via the reactive compound. The bottom S atom may be removed via selective sputtering of the reactive compound (physical desorption step).

In this manner, the $MoS_2$ molecular layer may be precisely removed one by one. In this connection, the reactive compound may be provided in a form of an ion beam. When the chemical adsorption via the radicals or the physical desorption via the reactive compounds are performed respectively, there is no change on a surface of an etching target material. However, when the chemical adsorption and the physical desorption are performed in the same cycle in accordance with the present disclosure, a mono layer may be removed without damaging the etching target material. Therefore, selectively etching the transition metal dichalcogenide thin film on which the first mask pattern is formed using plasma may allow removing the molecular layer more precisely to achieve the desired pattern and size, as compared to the conventional wet etching, and the etching using annealing process. Further, a process temperature in the present scheme is lower (that is, room temperature) than that of the conventional wet etching process and the annealing process. Thus, the present removal scheme does not damage the transition metal dichalcogenide thin film. Thus, the number of molecular layers may be controlled stably and precisely.

In this connection, in order to execute the atomic layer etching process of the transition metal dichalcogenide thin film composed of N+M molecular layers such that the transition metal dichalcogenide thin film having the first region having N+M molecular layers and the second region having the N molecular layers extending from the lower N molecular layers of the first region and being adjacent to the first region, the above-described removal process of etching one molecular layer may be repeated M times. That is, the number of molecular layers may be controlled to a target value by repeatedly performing the atomic layer etching. In this connection, the N may be at least 1.

In other words, selectively controlling the number of the molecular layers of the transition metal dichalcogenide thin film to have a desired pattern via the atomic layer etching of the transition metal dichalcogenide thin film on which a mask pattern is formed may allow producing the transition metal dichalcogenide thin film in accordance with the present disclosure having the regions with different numbers of the molecular layers and having heterojunctions formed between the regions.

In this process, the mask pattern may be formed by performing at least one of the photolithography or DSA (directed self-assembly) lithography using BCP (block copolymer). In this connection, forming the mask pattern on the transition metal dichalcogenide using the lithography may allow forming various patterns having a line width (a width of each of the regions) of 10 nm or smaller.

According to the present disclosure, selectively etching the transition metal dichalcogenide thin film via the atomic layer etching while forming various desired mask patterns thereon may allow producing the transition metal dichalcogenide thin film in accordance with the present disclosure in which the plurality of regions with the different numbers of the molecular layers form a variety of patterns and hetero junctions.

Figure 4A:
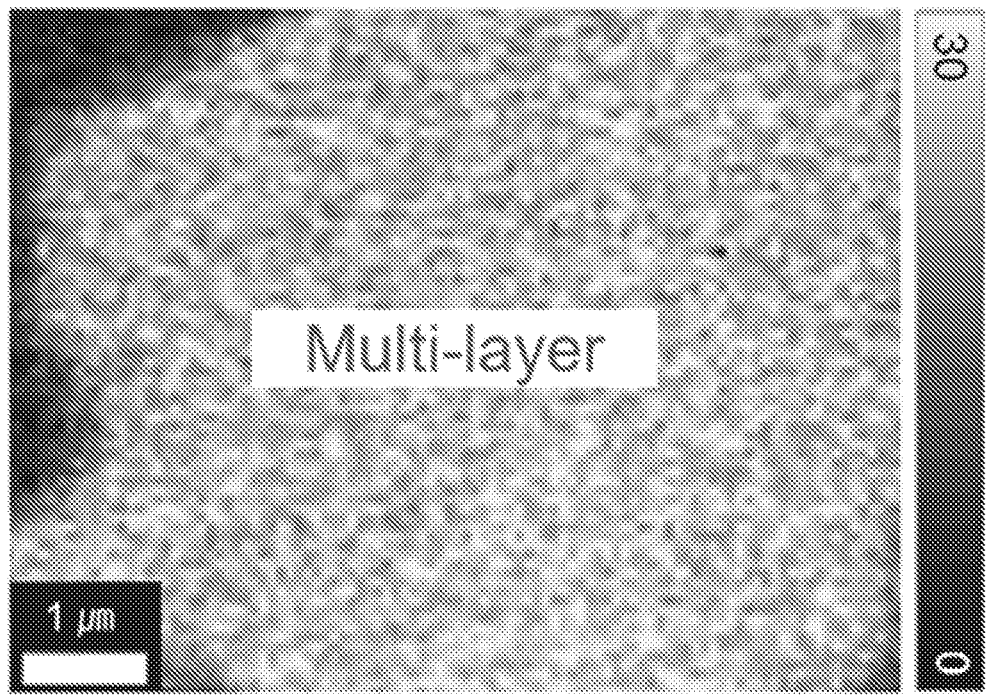
FIG. 4A illustrates a Raman mapping image measured for a $MoS_2$ thin film having six molecular layers.
Figure 4B:
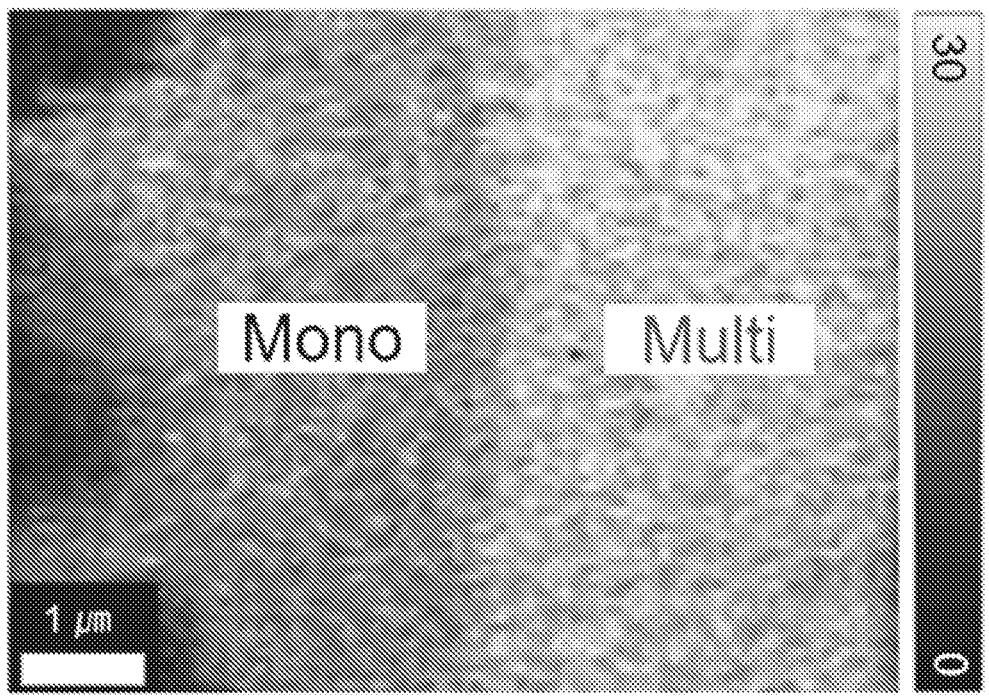
FIG. 4B illustrates a Raman mapping image measured for a $MoS_2$ thin film including a heterojunction of a region (Mono) having a single molecular layer, and a region (Multi) having six molecular layers.
Figure 5:
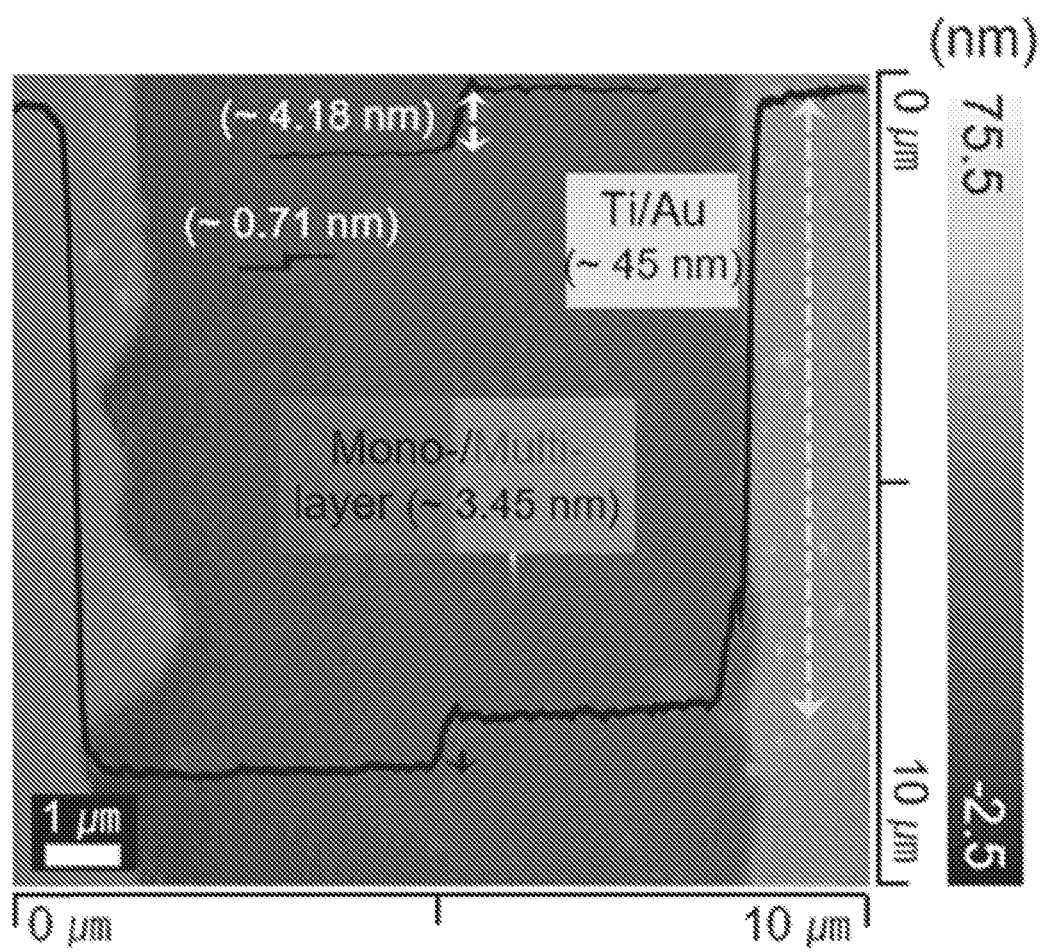
FIG. 5 illustrates a result of an AFM (atomic force microscopy) based thickness analysis for a $MoS_2$ thin film (b) including a heterojunction of a region (Mono) having a single molecular layer, and a region (Multi) having six molecular layers.

FIG. 4A illustrates a Raman mapping image measured for a $MoS_2$ thin film having six molecular layers, and FIG. 4B illustrates a Raman mapping image measured for a $MoS_2$ thin film including a heterojunction of a region (Mono) having a single molecular layer, and a region (Multi) having six molecular layers. FIG. 5 shows a result of an AFM (atomic force microscopy) based thickness analysis for a $MoS_2$ thin film including a heterojunction of a region (Mono) having a single molecular layer, and a region (Multi) having six molecular layers.

Referring to FIGS. 4A and 4B, when five cycles of selective atomic layer etching are executed on the second region of the $MoS_2$ thin film with six molecular layers, only the second region was selectively converted to only have a single molecular layer, thus resulting in the hetero junction formed between the single molecular layer region and the first region having six molecular layers.

Referring to FIG. 5, the single molecular layer based region has a thickness of about 0.71 nm. The 6 molecular layers-containing region has a thickness of 4.18 nm. It may be seen that a dimension of a step between the single molecular layer-containing region and the 6 molecular layers-containing region is about 3.45 nm. That is, in the multilayer $MoS_2$ thin film, the number of molecular layers may be precisely controlled via the atomic layer etching process. Thus, when using the selective atomic layer etching process, the $MoS_2$ thin film having two or more regions having different numbers of the molecular layers may be precisely formed.

Figure 6A:
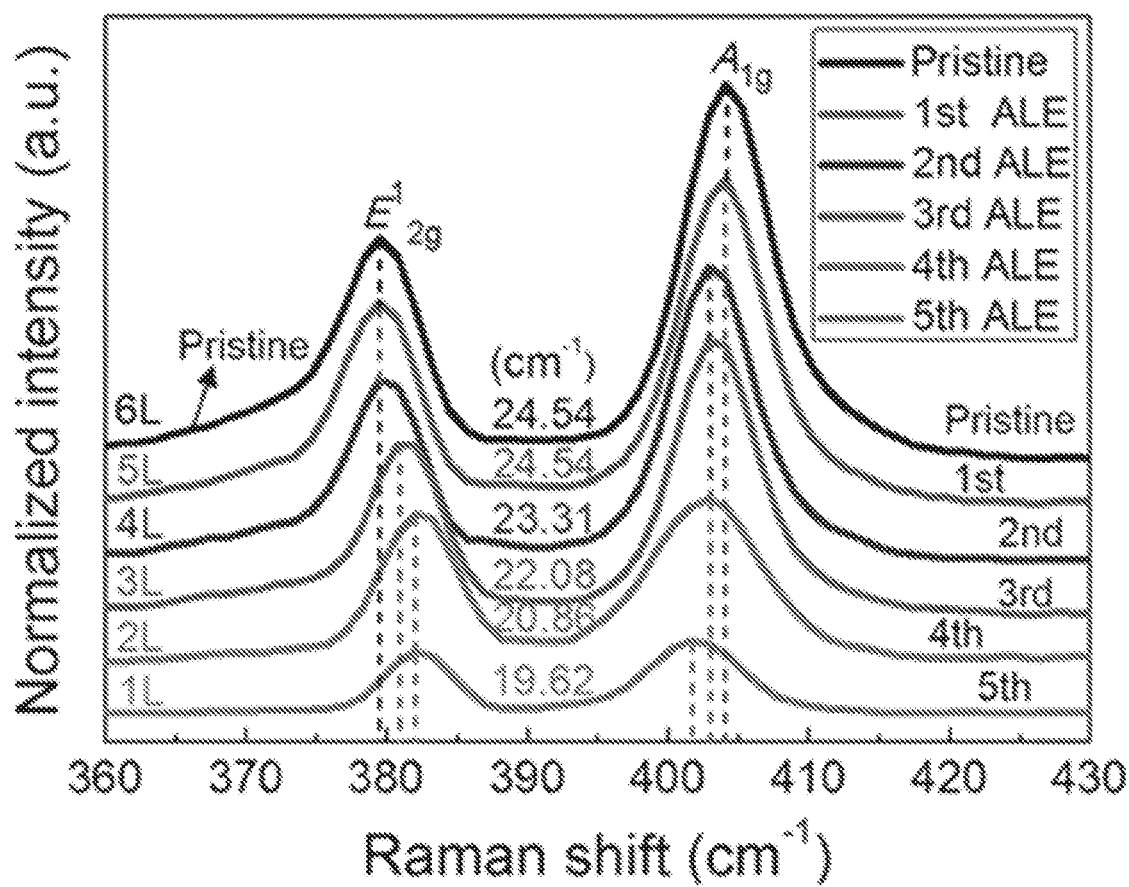
FIG. 6A illustrates a Raman spectra.
Figure 6B:
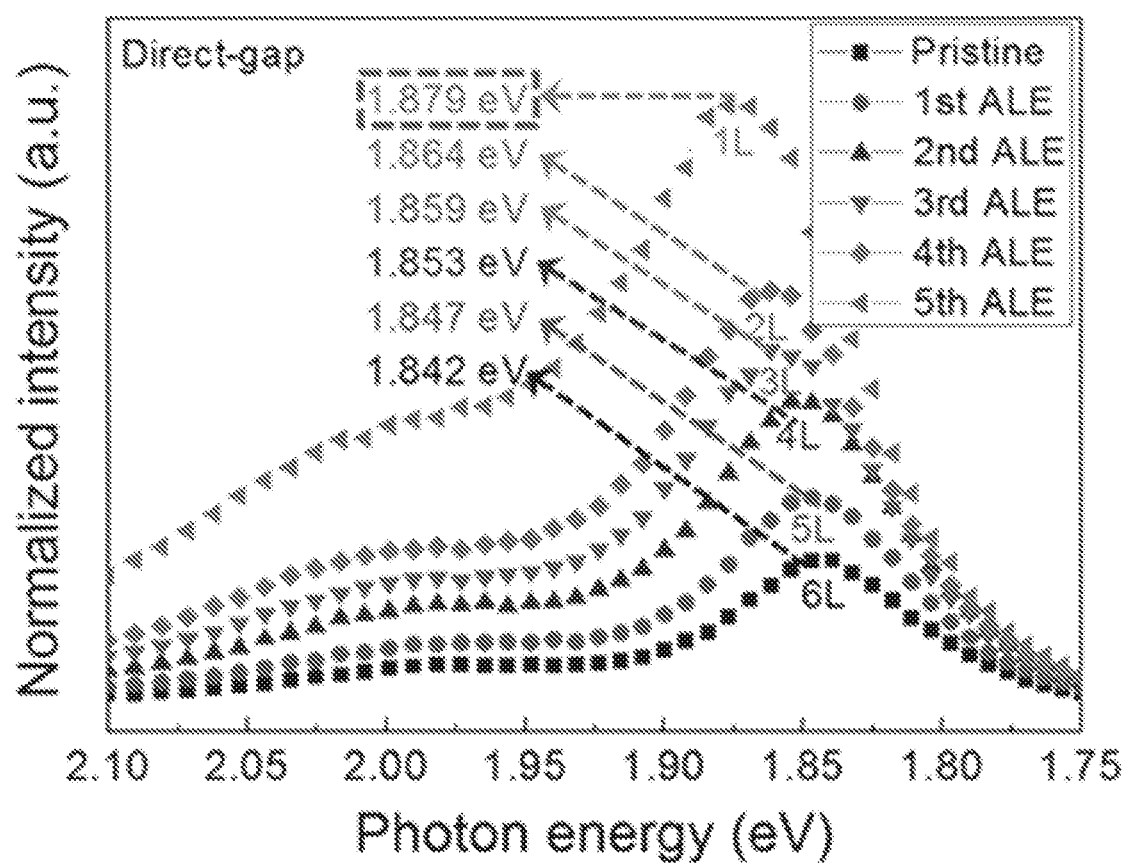
FIG. 6B illustrates a PL spectra measured based on the number of cycles of an atomic layer etching process performed on a $MoS_2$ thin film having 6 molecular layers.

FIG. 6A illustrates a Raman spectra, and FIG. 6B illustrates a PL spectra measured based on the number of cycles of an atomic layer etching process performed on a $MoS_2$ thin film having 6 molecular layers.

Referring to FIGS. 6A and 6B, a gap distance between a $E^1_{2g}$ peak and a $A_{1g}$ peak decreases from 24.54 $cm^{-1}$ to 19.62 $cm^{-1}$. In this way, it may be seen that the 6 molecular layers-containing $MoS_2$ region was converted to a single molecular layer-containing $MoS_2$ region via the five times execution of the atomic layer etching process.

Further, as the number of cycles of the atomic layer etching process increases, that is, as the number of molecular layers of the $MoS_2$ thin film decreases, the PL intensity and the direct gap energy increase. In particular, the direct gap energy of the $MoS_2$ thin film after the 5 cycles execution of the atomic layer etching process was measured to be 1.879 eV corresponding to the single molecular layer-containing $MoS_2$ thin film. The indirect gap energy of the $MoS_2$ thin film having 6 molecular layers before the atomic layer etching process was 1.394 eV. In this way, it may be seen that due to the heterojunction formed between the single molecular layer-based region and the 6 molecular layers-based region, a staggered gap alignment having an interlayer gap of about 0.49 eV is realized.

Figure 7A:
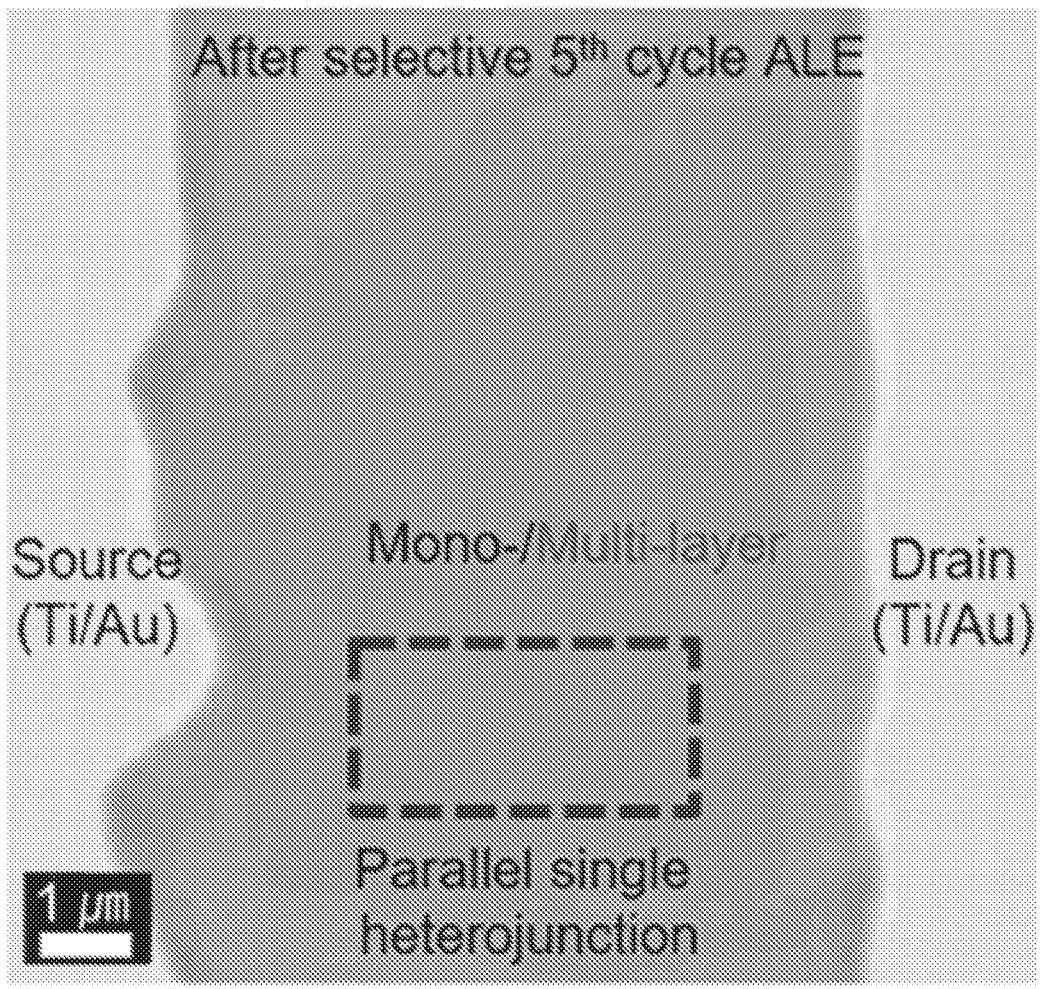
FIG. 7A illustrates an optical microscope image of a device having a $MoS_2$ thin film having a heterojunction of a region having a single molecular layer and a region having 6 molecular layers and source and drain electrodes sandwiching the thin film therebetween.
Figure 7B:
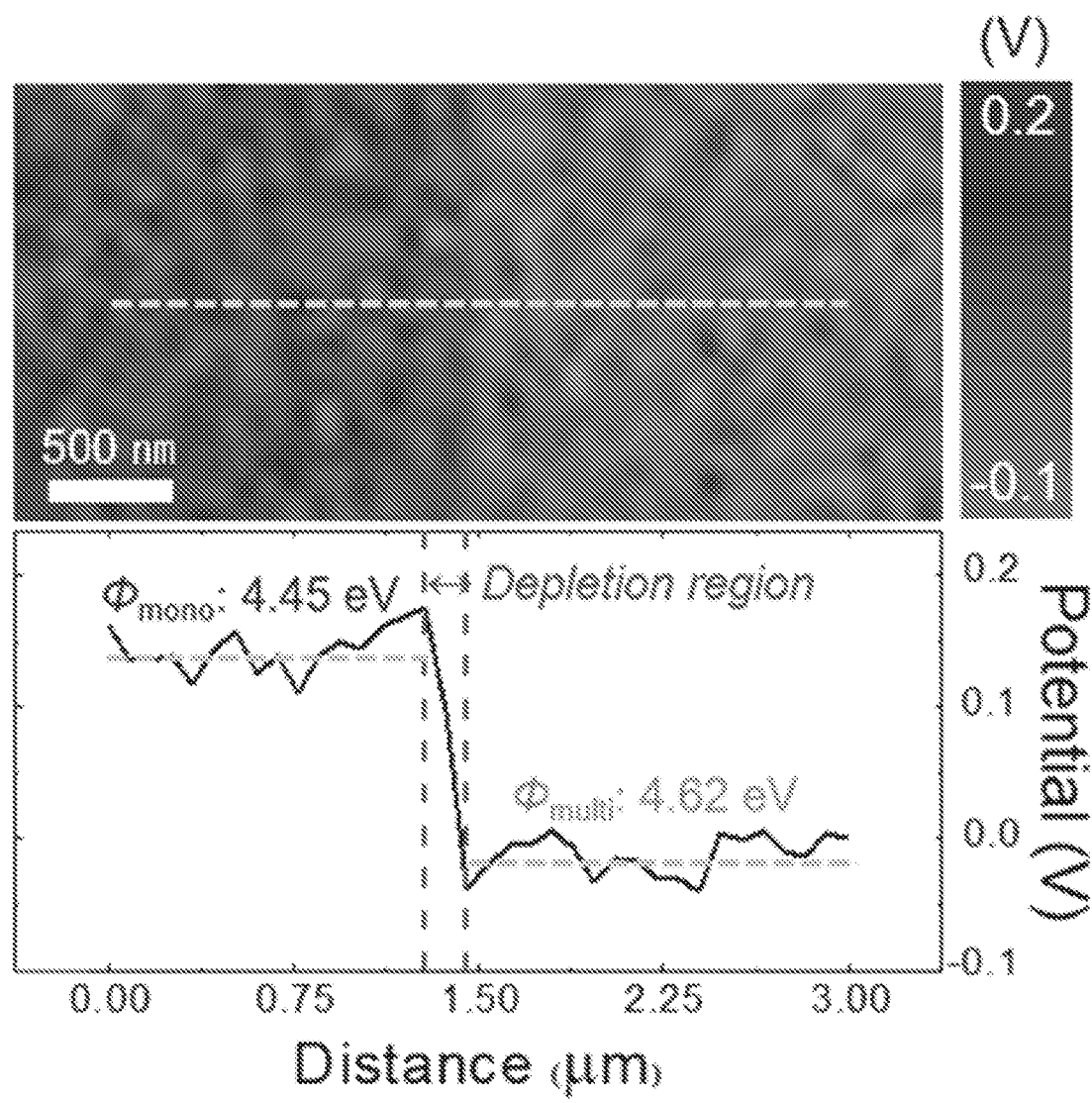
FIG. 7B illustrates a KPEM (Kelvin probe force microscopy) analysis result of a heterojunction region within a rectangular dotted region of the image in FIG. 7A.

FIG. 7A illustrates an optical microscope image of a device having a $MoS_2$ thin film having a heterojunction of a region having a single molecular layer and a region having 6 molecular layers and source and drain electrodes sandwiching the thin film therebetween. FIG. 7B illustrates a KPEM (Kelvin probe force microscopy) analysis result of a heterojunction region within a rectangular dotted region of the image of FIG. 7A.

Referring to FIG. 7A, the work functions of the single molecular layer based region and the 6 molecular layers based region are 4.45 eV and 4.62 eV, respectively. A depletion region is formed in the hetero-junction region formed between the single molecular layer-based region and the 6 molecular layers based region.

Figure 8:
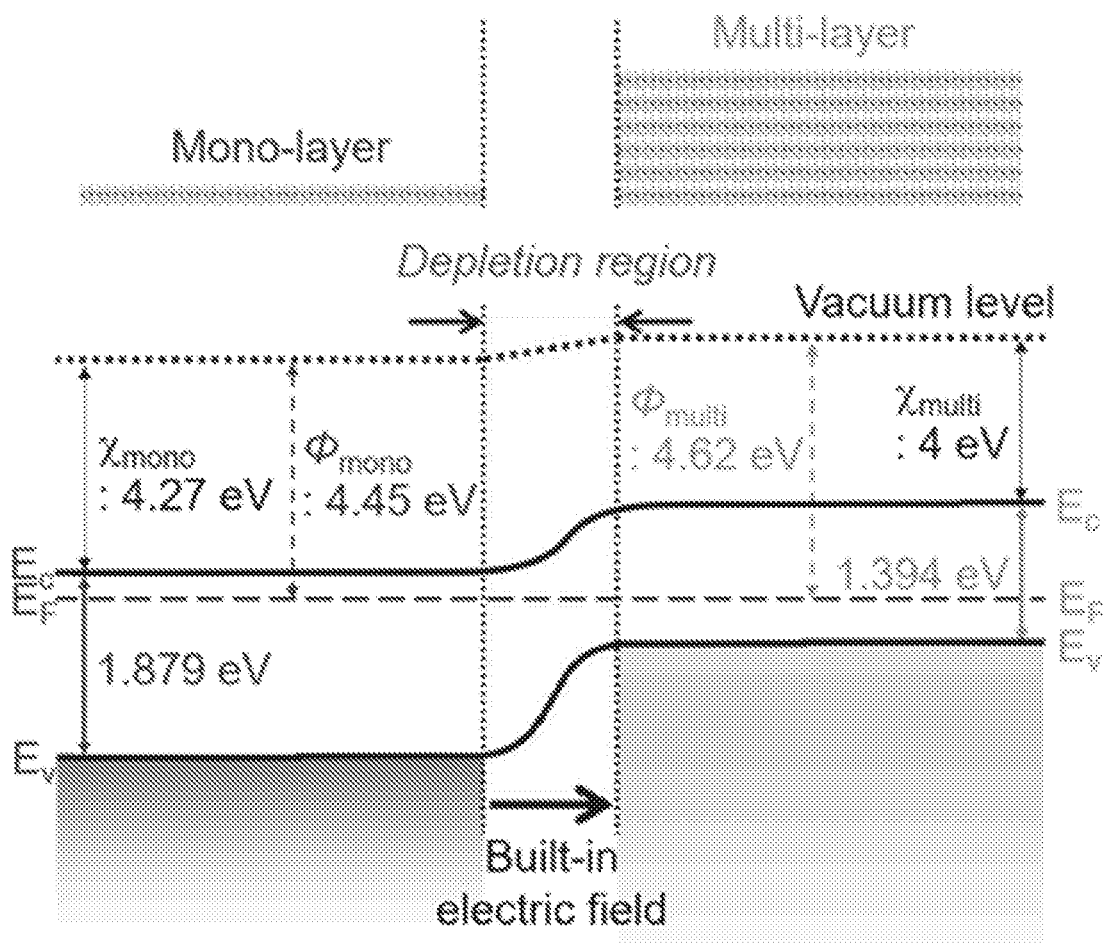
FIG. 8 illustrates an energy band diagram of a heterojunction between a single molecular layer-based region and a 6 molecular layer-based region in a $MoS_2$ thin film.

FIG. 8 shows an energy band diagram of a heterojunction between a single molecular layer based region and a 6 molecular layers based region in a $MoS_2$ thin film.

Referring to FIG. 8, the differences in the electron affinity and the work function between the single molecular layer based region and the 6 molecular layers based region, the presence of the interlayer gap of about 0.49 eV therebetween, and the built-in electric field caused by the depletion region formed in in the hetero-junction region may allow the separation between electrons and the holes in the electron-hole pairs in the $MoS_2$ film occurring when light is irradiated thereto to be improved. As a result, the photocurrent may be increased.

Hereinafter, specific examples and experimental examples of the present disclosure will be described in detail. However, the following examples are merely embodiments of the present disclosure, and the scope of the present disclosure is not limited to the following examples.

PRESENT EXAMPLES AND COMPARATIVE EXAMPLES

FIG. 9A to FIG. 9F are perspective views illustrating photoelectronic devices according to Present Examples and Comparative Examples.

Figure 9A:
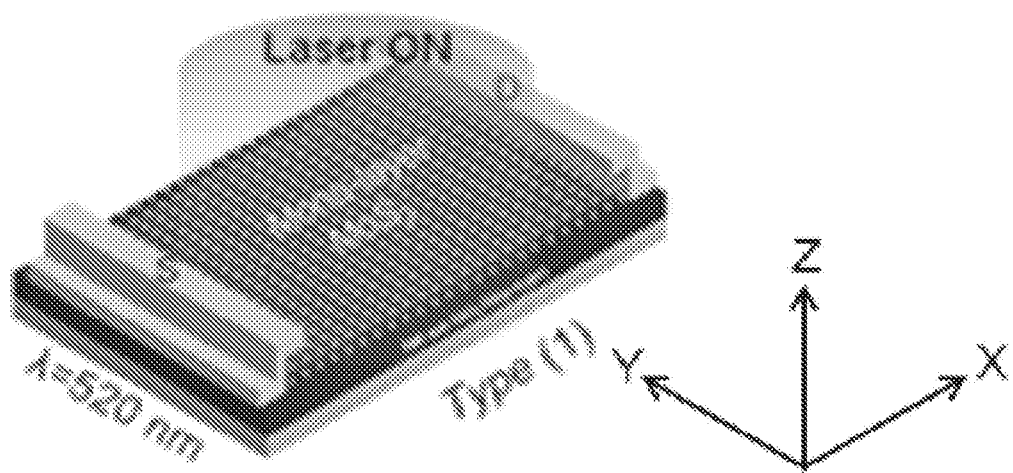
FIG. 9A to FIG. 9F are perspective views illustrating photoelectronic devices according to Present Examples and Comparative Examples.

As illustrated in FIG. 9A, a first photoelectronic device Type 1 was fabricated by forming a source electrode and a drain electrode made of Ti/Au at both end regions in an X-axis direction of the $MoS_2$ thin film having only a single molecular layer.

Figure 9B:
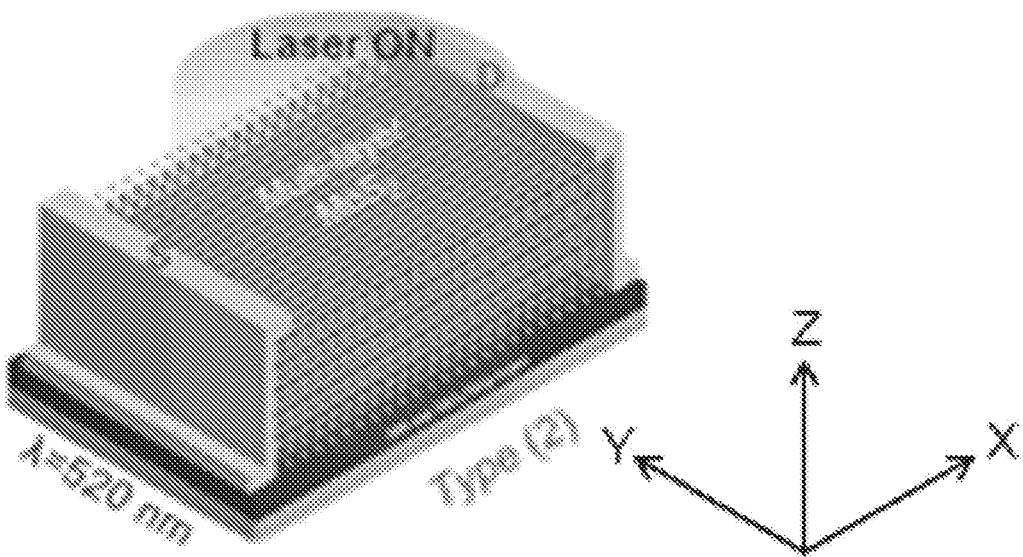

As illustrated in FIG. 9B, a second photoelectronic device Type 2 was fabricated by forming a source electrode and a drain electrode made of Ti/Au at both end regions in an X-axis direction of the $MoS_2$ thin film having 6 molecular layers.

Figure 9C:
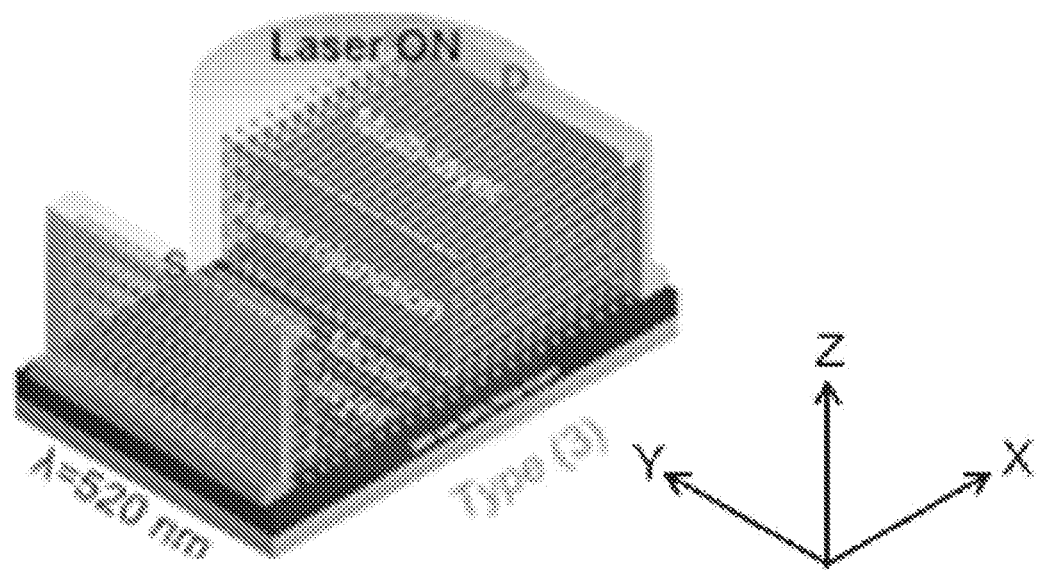

As illustrated in FIG. 9C, a third photoelectronic device Type 3 was fabricated by forming a source electrode and a drain electrode made of Ti/Au at both end regions in an X-axis direction of the $MoS_2$ thin film having one heterojunction (boundary plane) parallel to a YZ plane and formed between a first region having a single molecular layer and a second region having 6 molecular layers. In this connection, the heterojunction was prepared using a selective atomic layer etching process using a mask.

Figure 9D:
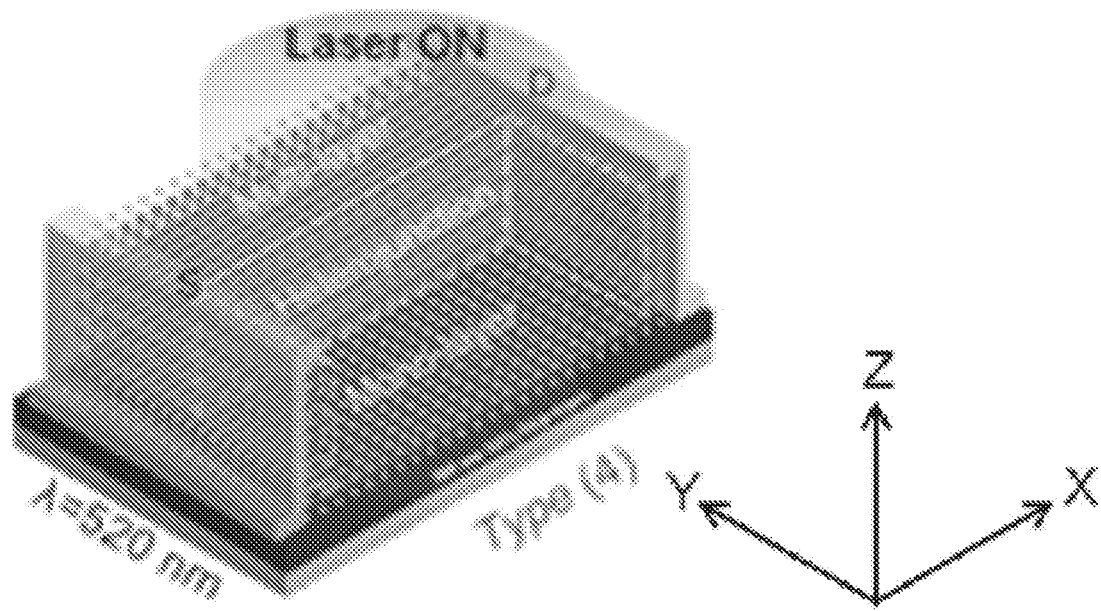

As illustrated in FIG. 9D, a fourth photoelectronic device Type 4 was fabricated by forming a source electrode and a drain electrode made of Ti/Au at both end regions in an X-axis direction of the $MoS_2$ thin film having one heterojunction (boundary plane) parallel to a XZ plane and formed between a third region having a single molecular layer and a fourth region having 6 molecular layers. In this connection, the heterojunction was prepared using a selective atomic layer etching process using a mask.

Figure 9E:
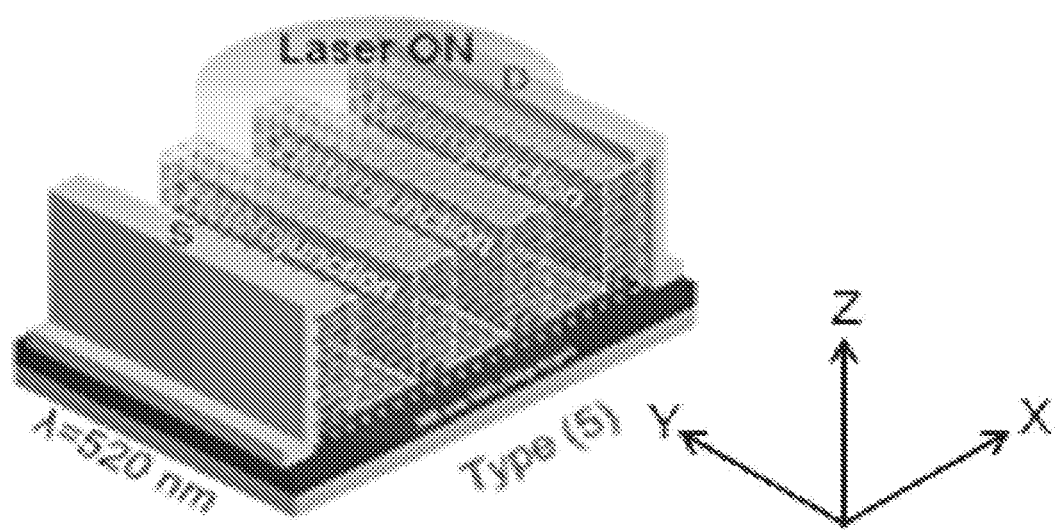

As illustrated in FIG. 9E, a fifth photoelectronic device Type 5 was fabricated by forming a source electrode and a drain electrode made of Ti/Au at both end regions in an X-axis direction of the $MoS_2$ thin film having a plurality of hetero-junctions (boundary planes) parallel to a YZ plane and formed respectively between a plurality of first regions, each having a single molecular layer and a plurality of second regions, each having 6 molecular layers. In this connection, the heterojunction was prepared using a selective atomic layer etching process using a mask.

Figure 9F:
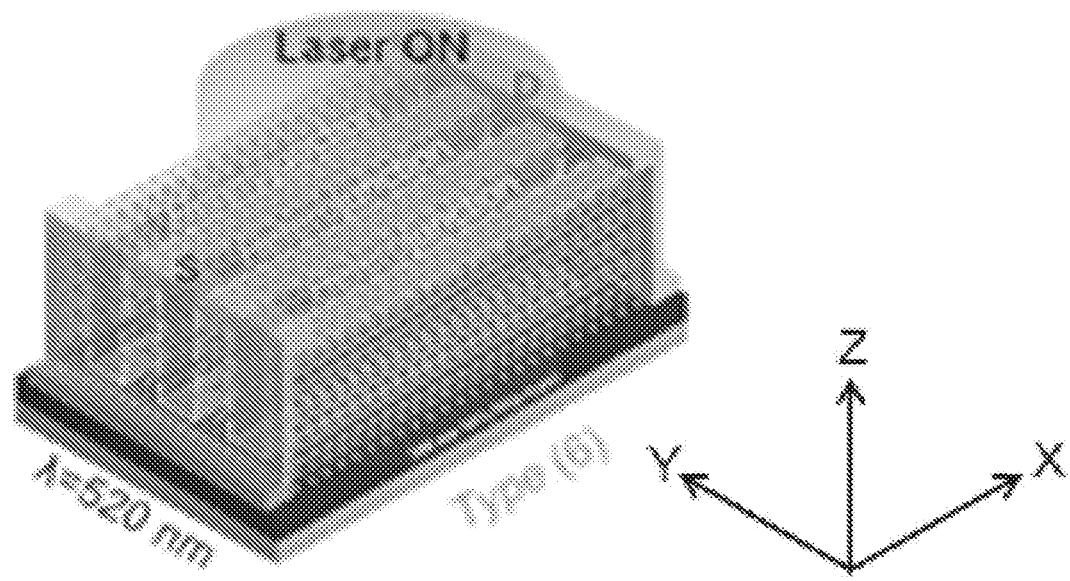

As illustrated in FIG. 9F, a sixth photoelectronic device Type 6 was fabricated by forming a source electrode and a drain electrode made of Ti/Au at both end regions in an X-axis direction of the $MoS_2$ thin film having a plurality of hetero-junctions (boundary planes) parallel to a XZ plane and formed respectively between a plurality of third regions, each having a single molecular layer and a plurality of fourth regions, each having 6 molecular layers. In this connection, the heterojunction was prepared using a selective atomic layer etching process using a mask.

EXPERIMENTAL EXAMPLES

Figure 10A:
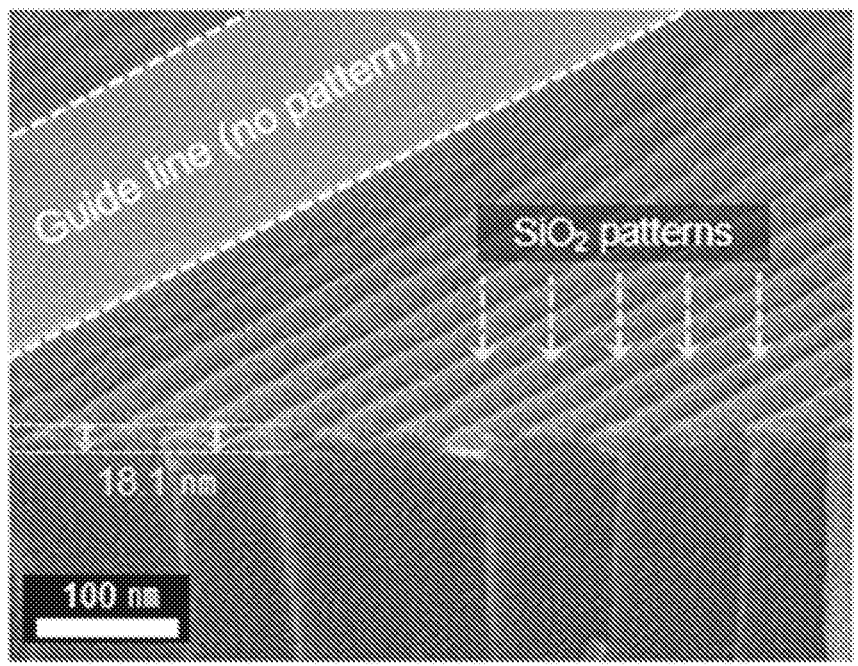
FIGS. 10A, 10B, and 10C illustrate a FE-SEM (field-emission scanning electron microscope) image of $SiO_2$ patterns formed on a $MoS_2$ thin film via an ultra-fine nano-transfer printing (S-nPT) process to form multi-heterojunctions on the $MoS_2$ thin film having 6 molecular layers.
Figure 10B:
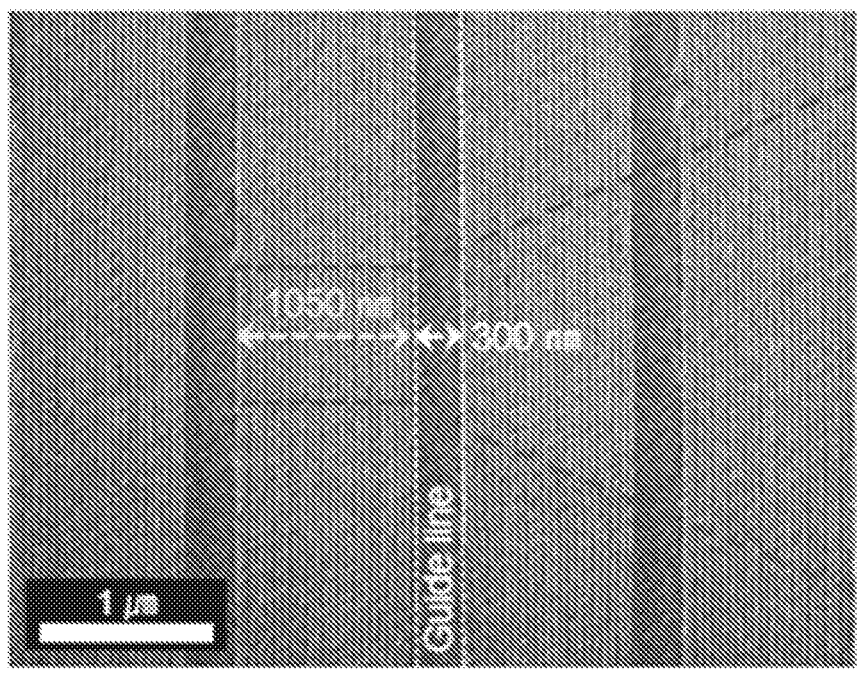
Figure 10C:
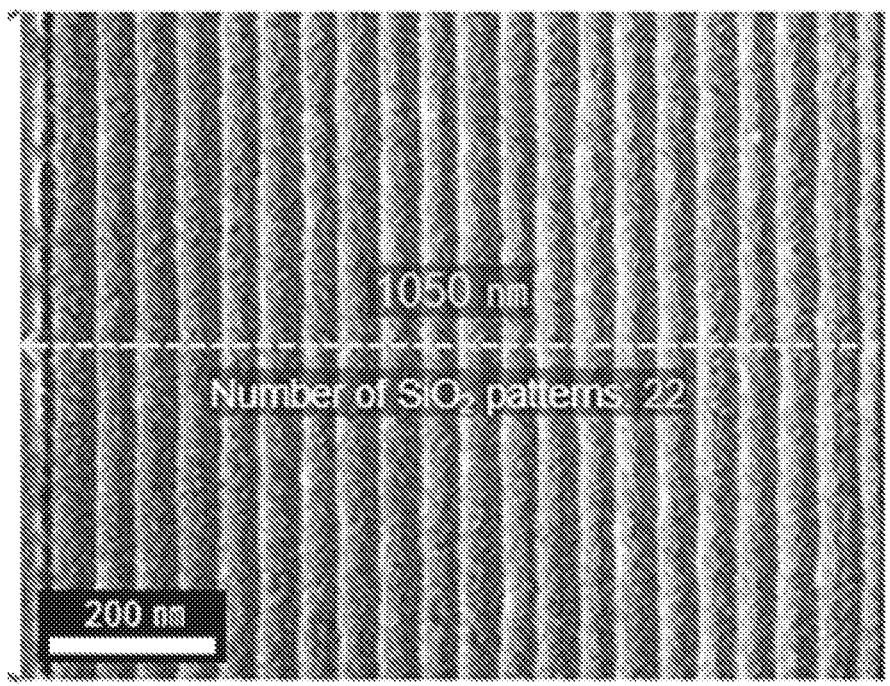
Figure 11A:
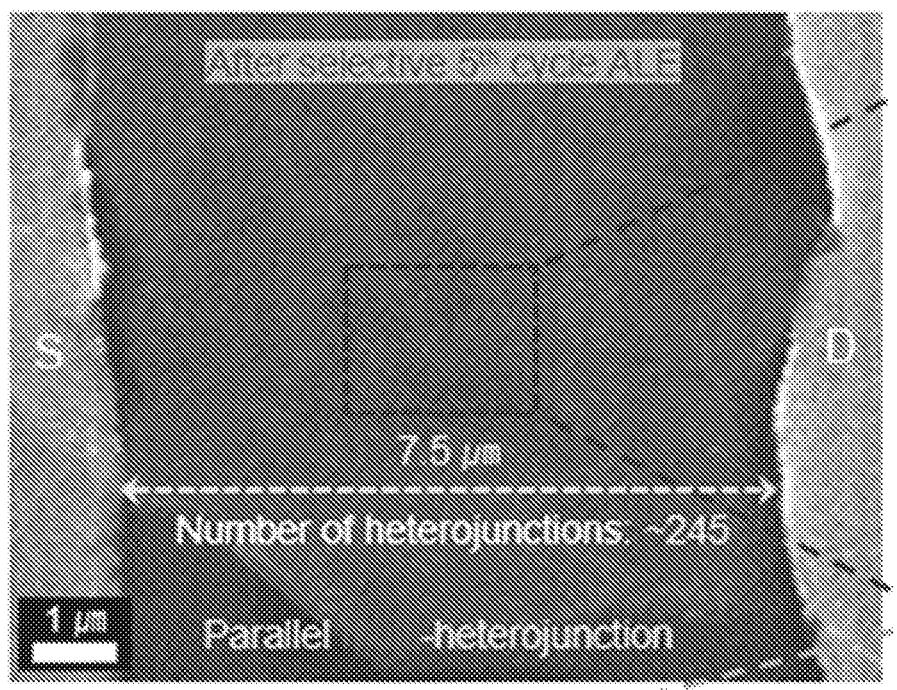
FIGS. 11A, 11B, 11C, and 11D illustrate FE-SEM images of a $MoS_2$ thin film after five cycles of an atomic layer etching process using $SiO_2$ patterns as a mask.
Figure 11B:
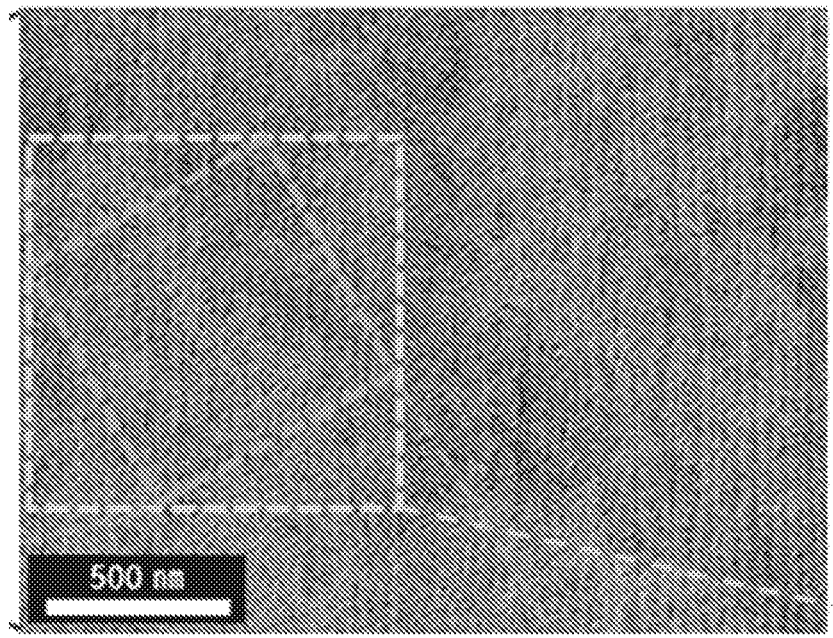
Figure 11C:
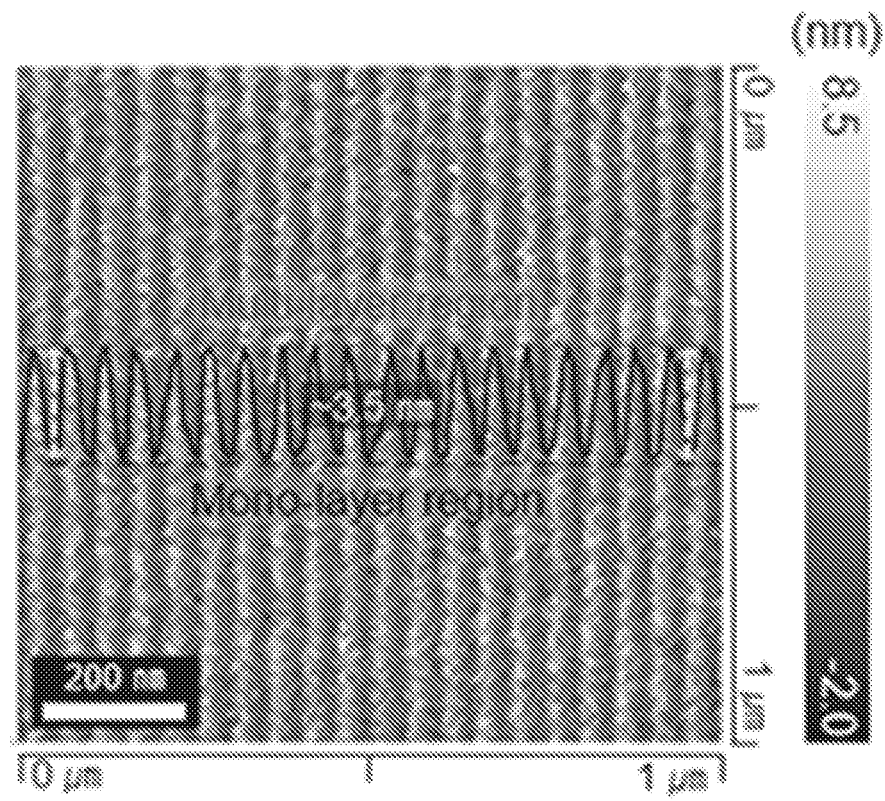
Figure 11D:
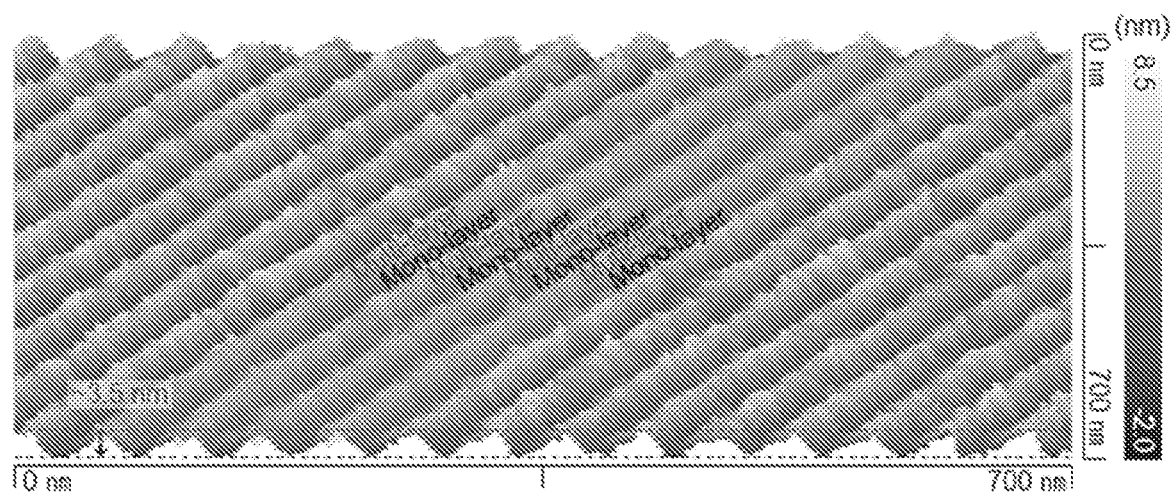

FIGS. 10A-10C illustrate a FE-SEM (field-emission scanning electron microscope) image of SiO2 patterns formed on a $MoS_2$ thin film via an ultra-fine nano-transfer printing (S-nPT) process to form multi-heterojunctions on the $MoS_2$ thin film having 6 molecular layers. FIG. 11 shows FE-SEM images of a $MoS_2$ thin film after five cycles of an atomic layer etching process using $SiO_2$ patterns in FIG. 10 as a mask.

Referring to FIGS. 10A-10C, each of the $SiO_2$ patterns formed on the $MoS_2$ thin film using the S-nTP process has a width of about 25 nm and a thickness of 18.1 nm and the patterns are linearly aligned at a period of about 50 nm. In addition, a white guideline may be applied to linearly align 25 nm $SiO_2$ patterns via the S-nTP process. The patterns may not be formed in this guideline.

As illustrated in FIGS. 10B and 10C, the SiO2 patterns are aligned in 1050 nm. A 300 nm guideline is located between the 1050 nm period patterns. 22 25 nm $SiO_2$ patterns are linearly aligned in 1050 nm at a 50 nm period.

Referring to FIGS. 11A-11D, after the 5 cycles of the atomic layer etching, HF solution (HF:deionized water=1: 100) was used to etch the film for 10 seconds to remove the $SiO_2$ patterns. As a result, about 245 heterojunctions were formed in the $MoS_2$ channel region (7.5 um). In this connection, it may be seen that the multi heterojunctions are formed very uniformly and each heterojunctions has a thickness of about 3.5 nm. The step between the single molecular layer based region and the 6 molecular layers based region was about 3.5 nm.

Figure 12A:
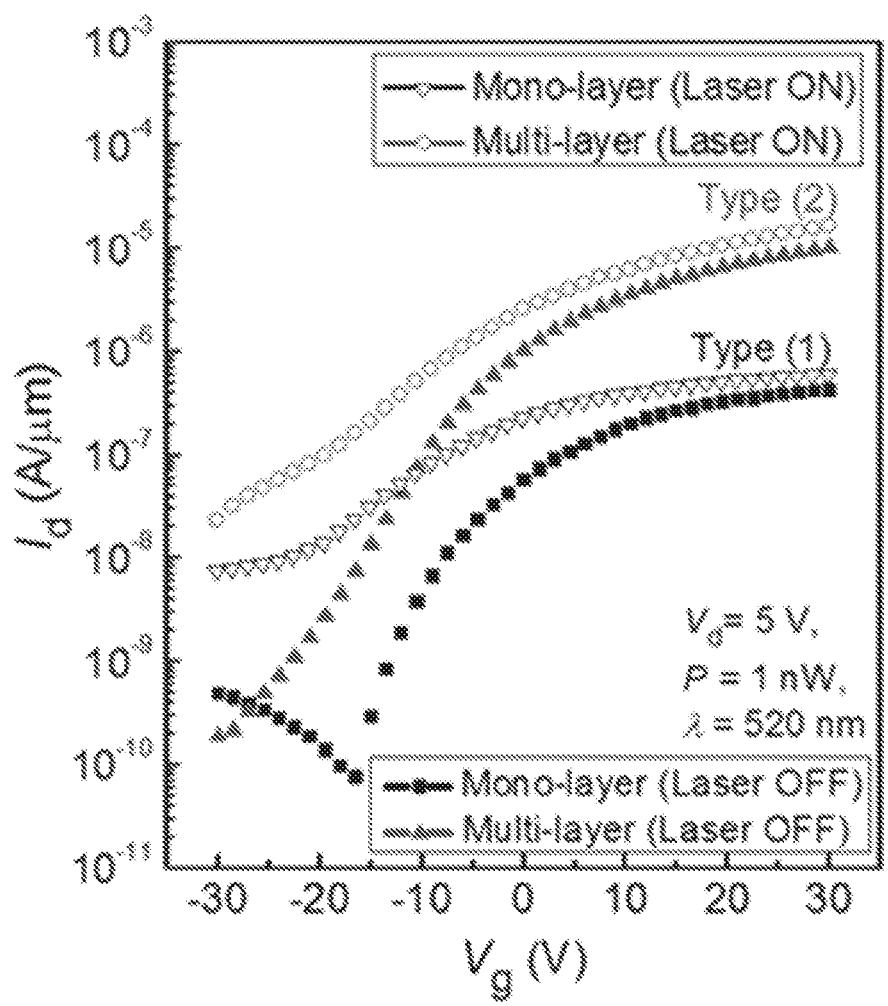
FIGS. 12A, 12B, and 12C illustrate graphs measuring $I_d$-$V_g$ characteristics based on/off of laser light ($\lambda$=520 nm and $P_{laser}$=1 nW) for first to sixth photoelectronic devices (Type 1, Type 2, Type 3, Type 4, Type 5, and Type 6).
Figure 12B:
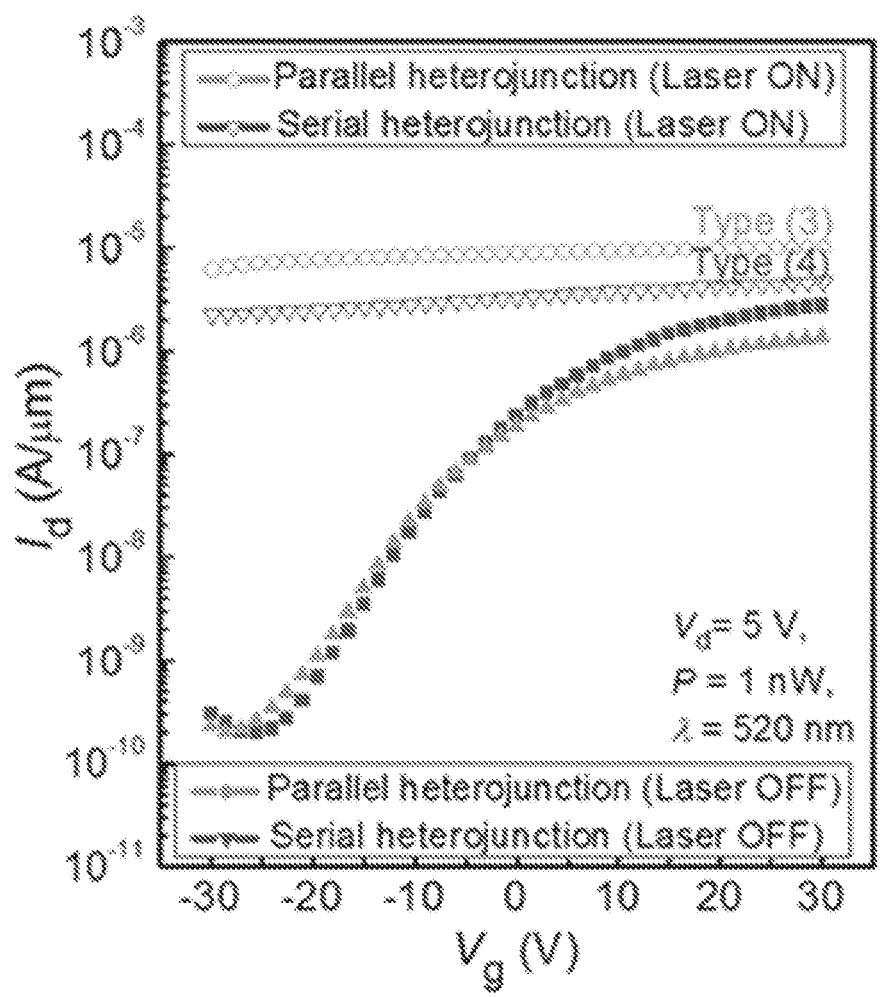
Figure 12C:
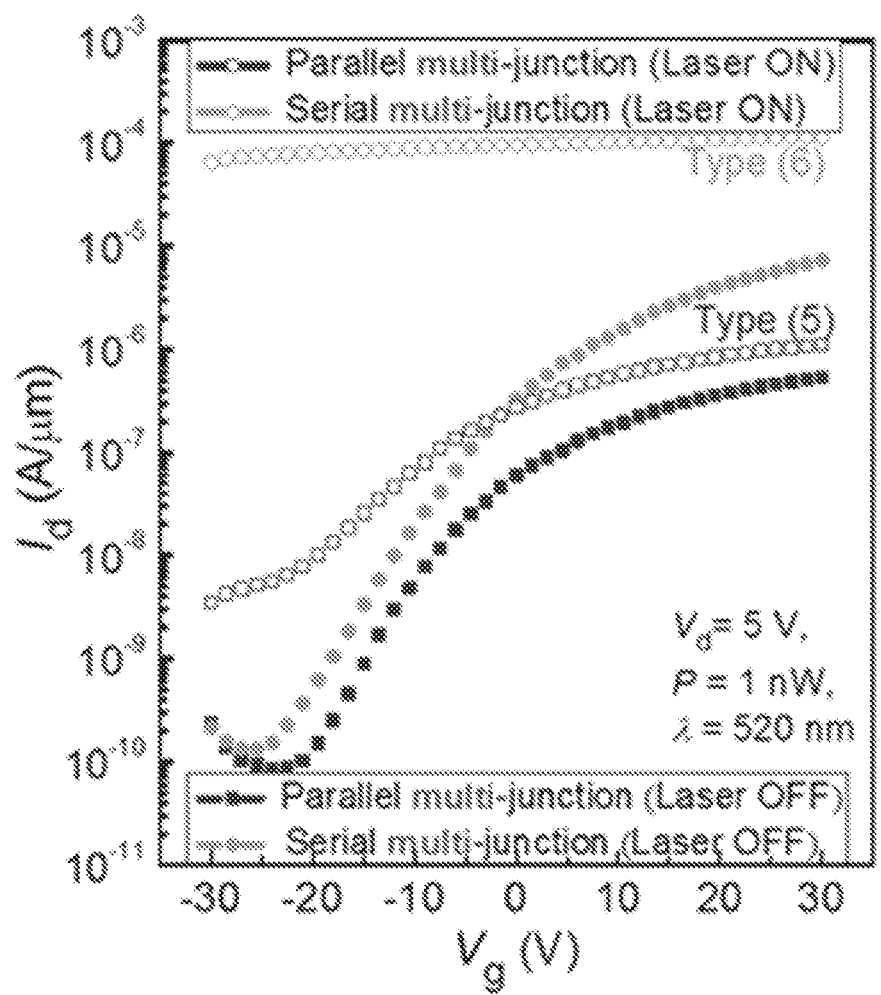

FIGS. 12A-12C illustrate graphs of measuring $I_d$-$V_g$ characteristics based on/off of laser light ($\lambda$=520 nm and $P_{laser}$=1 nW) for first to sixth photoelectronic devices (Type 1, Type 2, Type 3, Type 4, Type 5, and Type 6).

Figure 13A:
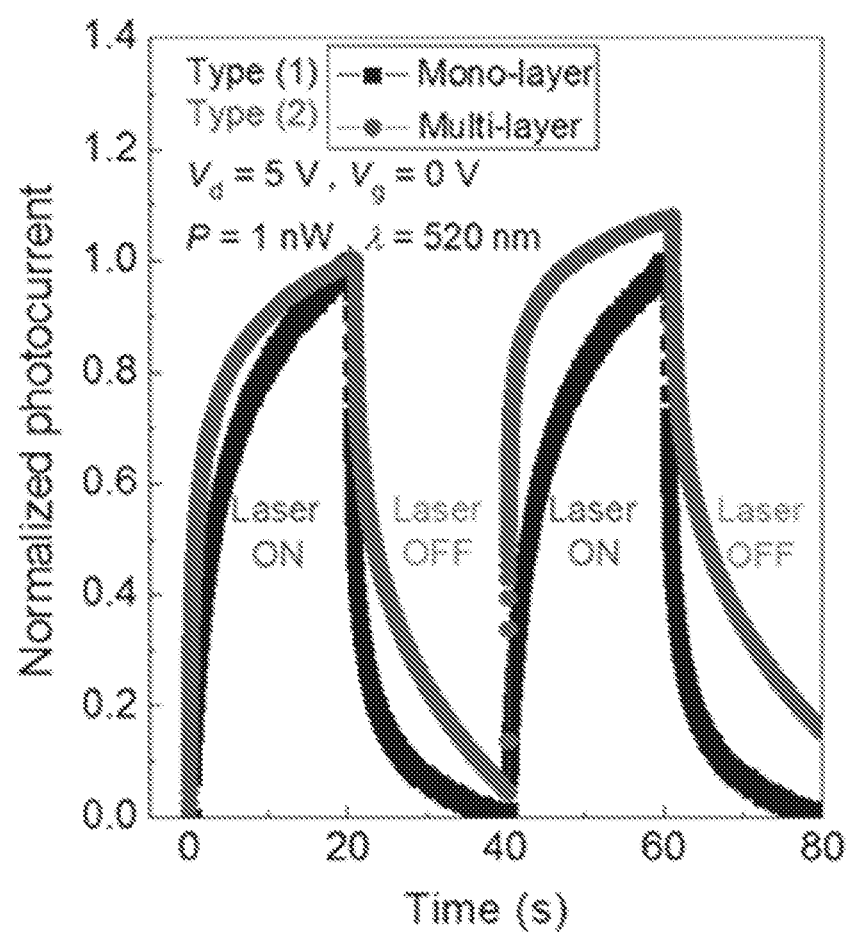
FIGS. 13A, 13B, and 13C illustrate graphs showing photo-response characteristics measured for the first to sixth photoelectronic devices (Type 1, Type 2, Type 3, Type 4, Type 5, and Type 6).
Figure 13B:
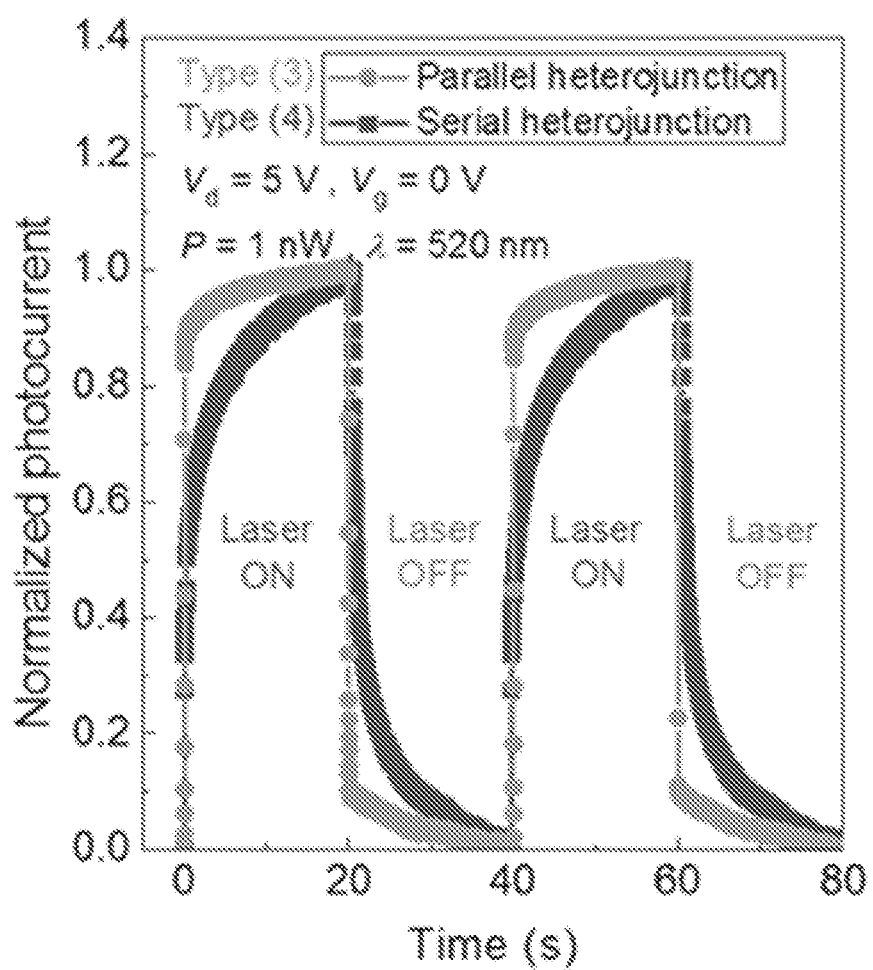
Figure 13C:
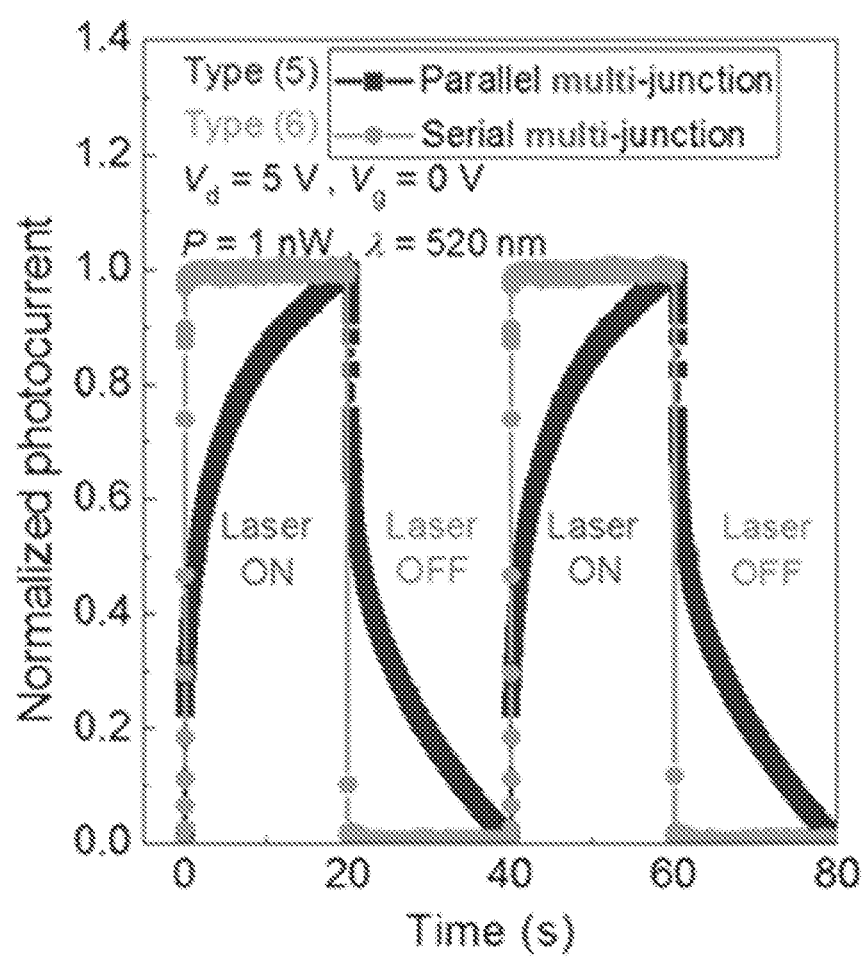
Figure 14A:
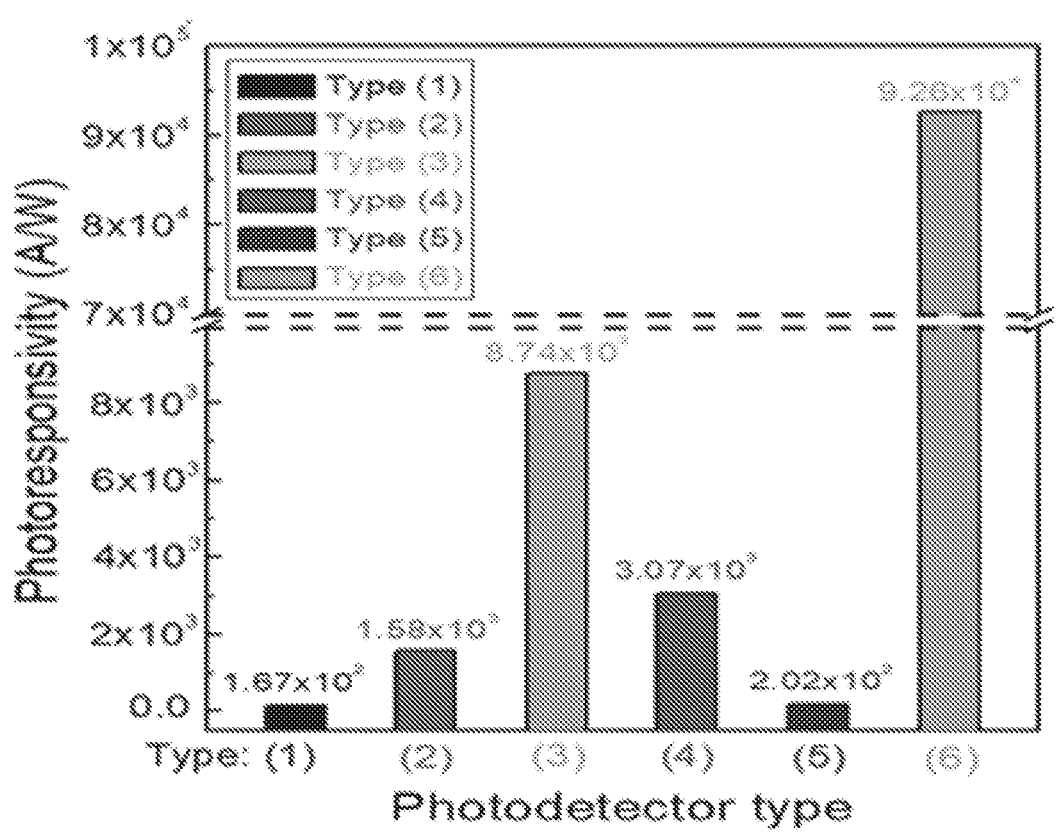
FIGS. 14A, 14B, and 14C illustrate graphs of photoresponsivity and photo-response times (rise time, decay time) measured for the first to sixth photoelectronic devices (Type 1, Type 2, Type 3, Type 4, Type 5, and Type 6).
Figure 14B:
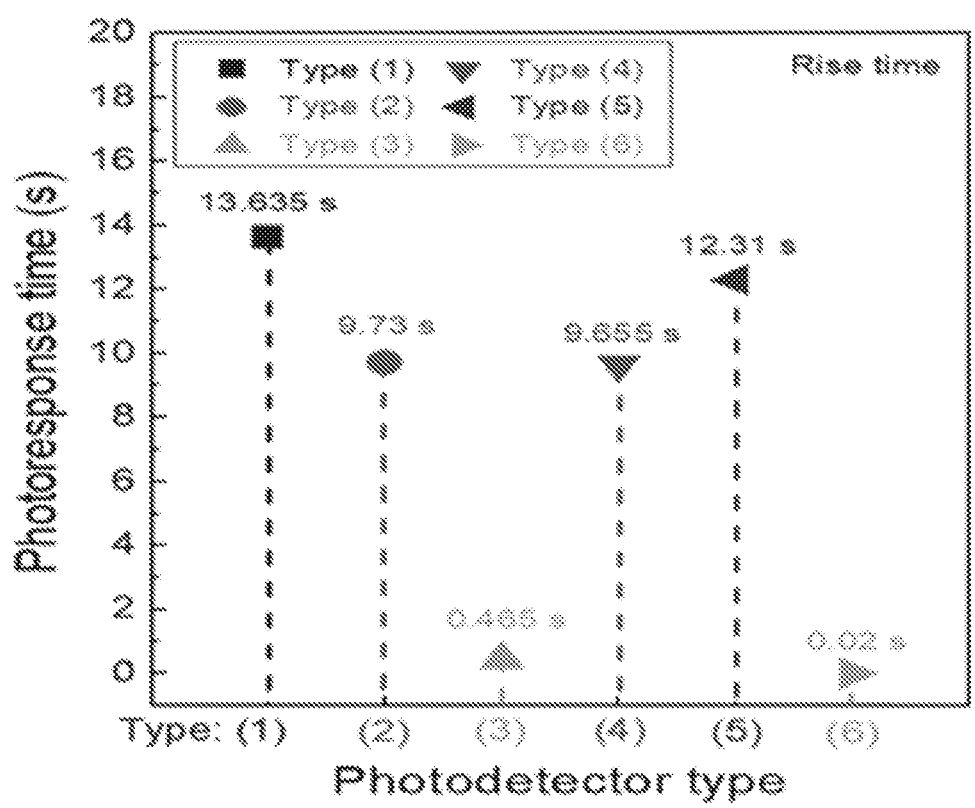
Figure 14C:
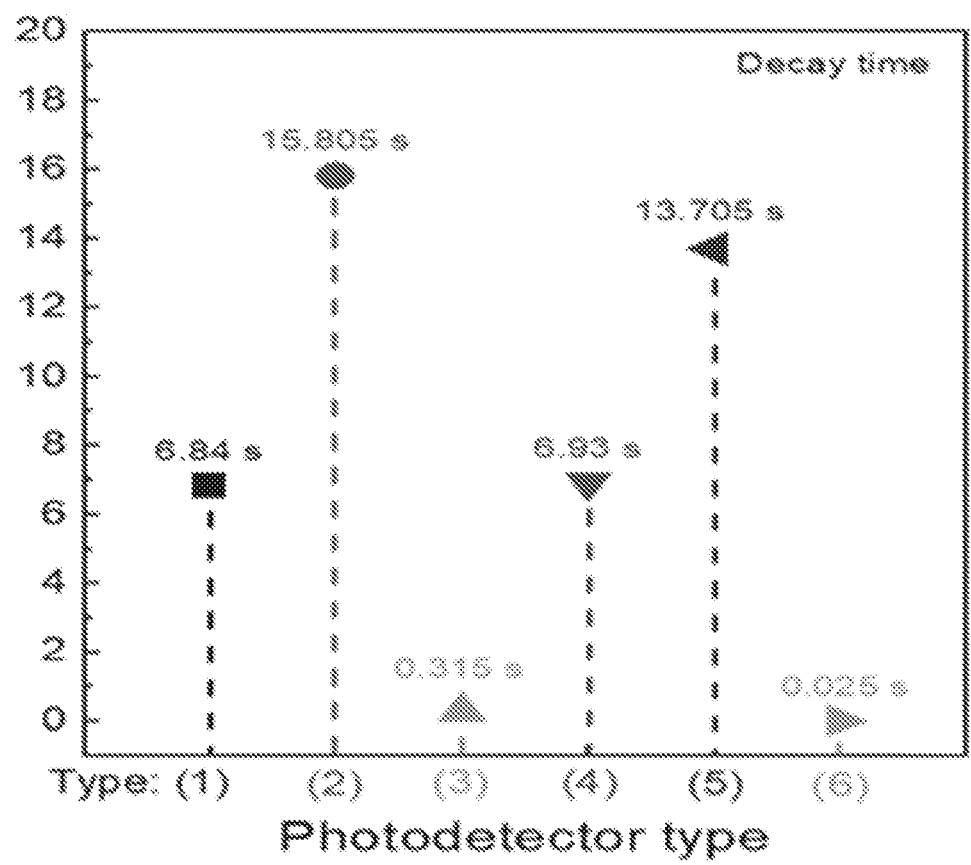

FIGS. 13A-13C illustrate graphs showing photo-response characteristics measured for the first to sixth photoelectronic devices (Type 1, Type 2, Type 3, Type 4, Type 5, and Type 6). FIGS. 14A-14C illustrate graphs of photoresponsivity and photo-response times (rise time, decay time) measured for the first to sixth photoelectronic devices (Type 1, Type 2, Type 3, Type 4, Type 5, and Type 6). In FIGS. 13A-13C, while the irradiated laser ($\lambda$=520 nm and $P_{laser}$=1 nW) and the applied bias voltage ($V_d$=5V, $V_g$=0V) were constant, both photoresponsivity and photo-response time were measured. The photo-response curve was normalized such that a peak value is "1".

Referring to FIG. 12A to FIG. 14C, the photoresponsivity ($1.58 \times 10^3$ A/W) was about 9.46 times higher in the second photoelectronic device Type 2 including the $MoS_2$ thin film with the 6 molecular layers as a channel than the photoresponsivity ($1.67 \times 10^2$ A/W) in the first photoelectronic device Type 1 including a $MoS_2$ thin film with a single molecular layer as a channel. This is because the exciton binding energy about 0.23 eV of the 6 molecular layers based $MoS_2$ film is lower than the exciton binding energy about 0.4 eV of the single molecular layer based $MoS_2$ film and the 6 molecular layers based $MoS_2$ film may have more photocarriers accumulated therein. In particular, as illustrated in FIG. 13A, due to the low exciton binding energy and the large charge storage capacity of the 6 molecular layers based $MoS_2$ thin film compared to those of the single molecular layer based $MoS_2$ thin film, the rise time 9.73 s of photoresponsivity of the second photoelectronic device may be smaller than that 13.635 s of the first photoelectronic device. In terms of the decay time of the photoresponsivity, both photocarrier (electrons and holes) remain while not being recombined with each other. Thus, it may be seen that the photocurrent peak value of the second photoelectronic device is larger than that of the first photoelectronic device in a laser on interval of 40 to 60 s. Further, the first photoelectronic device has slower rise but faster decay of the photoresponsivity than those of the second photoelectronic device. This is because electron-hole recombination is achieved faster due to the direct gap of the single molecular layer based $MoS_2$ thin film.

In one example, the photoresponsivity $8.74 \times 10^3$ A/W of the third photoelectronic device Type 3 including a horizontal single heterojunction, and the photoresponsivity $3.07 \times 10^3$ A/W of the fourth photoelectronic device Type 4 including $MoS_2$ thin film including a vertical direction single heterojunction as a channel are larger than that $1.58 \times 10^3$ A/W of the second photoelectronic device. This may be because the difference between the electron affinities and the difference between work functions and formation of interlayer gap due to the different band gaps, and the built-in electric field created by the depletion region formed in the hetero-junction region may occur, thereby improving separation between electrons and holes in electron-hole pairs such that photoelectric properties such as photoresponsivity and photo-response time of the device may be improved. These features may also be seen in the photo-response time measurement. Rising time/decay time of the third and fourth photoelectronic devices are '0.465 s/0.315 s' and '9.655 s/6.93 s', respectively which are 20.9/50.2 times smaller than those of 9.73 s/15.805 s of the second photoelectronic device.

In one example, when the $MoS_2$ thin film channel contains a single heterojunction, the third photoelectronic device in which the heterojunction is formed in the horizontal direction exhibits improved photo-response characteristics compared to the fourth photoelectronic device in which the heterojunction is formed in the vertical direction.

In contrast, when the $MoS_2$ thin film channel contains multiple heterojunctions, the sixth photoelectronic device in which the heterojunction was formed in the vertical direction exhibited significantly improved photo-response characteristics compared to the fifth photoelectronic device in which the heterojunction was formed in the horizontal direction. Specifically, the photoresponsivity of the fifth photoelectronic device is $2.02 \times 10^2$ A/W, which is about 7.8 times smaller than that of the second photoelectronic device, but the photoresponsivity of the sixth photoelectronic device is $9.26 \times 10^4$ A/W which increases by about 58.6 times compared to that of the second photoelectronic device. This is because 245 heterojunctions formed in the fifth photoelectronic device in the horizontal direction act as a barrier that interferes with the carrier transport and the channel scattering occurs to cause deterioration of the optical sensing characteristic. In contrast, the heterojunction formed in the sixth photoelectronic device in the vertical direction does not function as a barrier against the carrier transport. Further, in the sixth photoelectronic device, the faster separation and recombination of the electrons and holes are improved to the maximum due to the interlayer gap about 0.49 eV of about 326 heterojunctions in the channel width of about 10 μm and the built-in electric field generated by the depletion region. Thus, the sixth photoelectronic device exhibits significantly improved photo-response characteristics compared to that of the fifth photoelectronic device. These features occur in the photo-response curve. The rising time/decay time of the sixth photoelectronic device are 0.02 s/0.025 s, which are 486.5 times/632.2 times smaller than those 12.31 s/13.705 s of the fifth photoelectronic device.

Figure 15A:
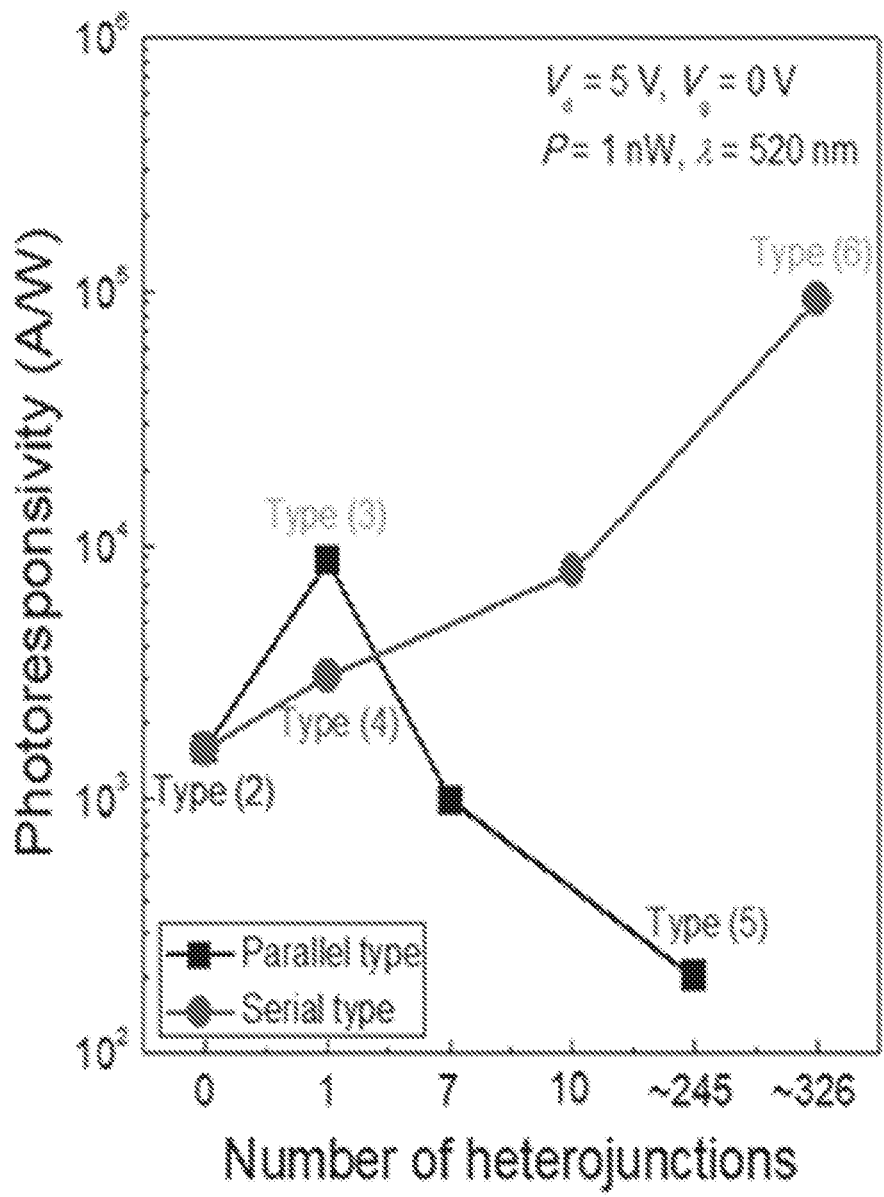
FIGS. 15A and 15B illustrate graphs of photoresponsivity and photo-response time variation based on the number of heterojunctions in the fifth and sixth photoelectronic devices.
Figure 15B:
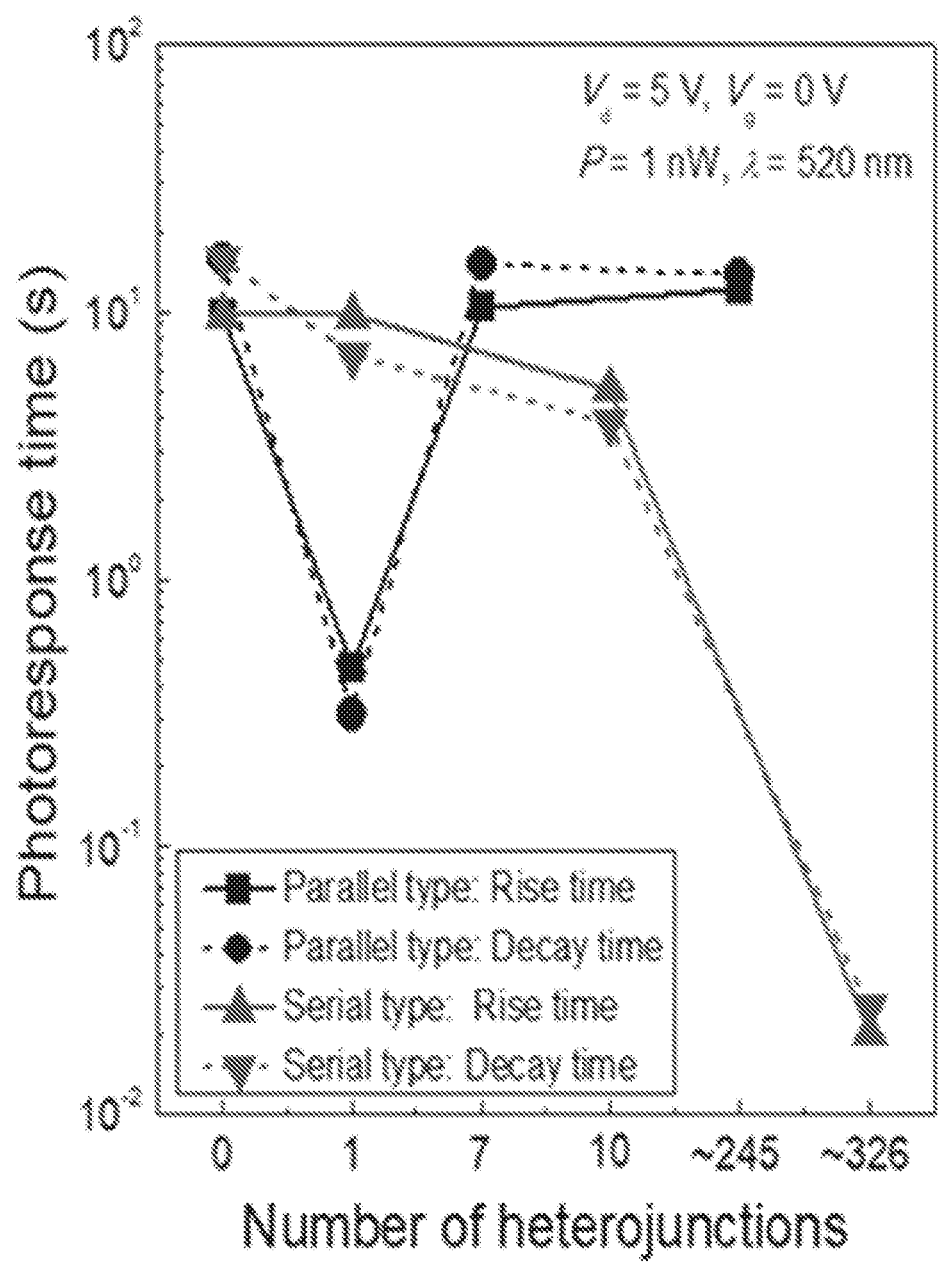

FIGS. 15A and 15B illustrates graphs of photoresponsivity and photo-response time variation based on the number of heterojunctions in the fifth and sixth photoelectronic devices.

Referring to FIGS. 15A and 15B, when the heterojunction was formed in the vertical direction, as the number of heterojunctions increased, photoresponsivity increased and photo-response time decreased. In particular, when the number of heterojunctions is 10 or more, photoresponsivity increases rapidly, and the photo-response time (rise time and decay time) decreased rapidly. In one example, the $MoS_2$ thin film channel includes about 10 or more hetero junctions.

In contrast, when the heterojunction was formed in the horizontal direction, photoresponsivity was highest when three heterojunctions existed. The photo-response time did not further improve when the number of the heterojunctions is larger than or equal to seven.

Figure 16A:
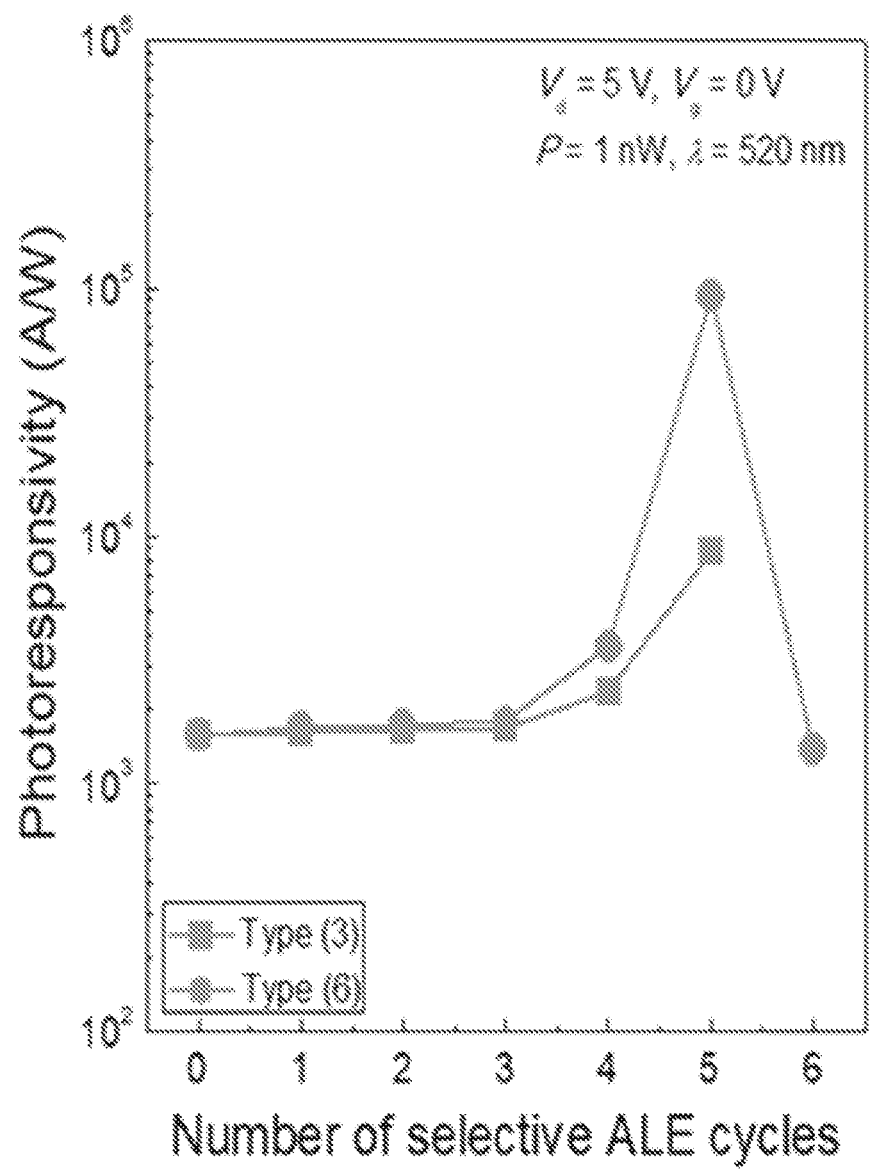
FIGS. 16A and 16B illustrate results of analyzing photoresponsivity and photo-response time based on the number of cycles of a selective atomic layer etching process for a $MoS_2$ thin film composed of 6 molecular layers in structures of the third photoelectronic device and the sixth photoelectronic device.
Figure 16B:
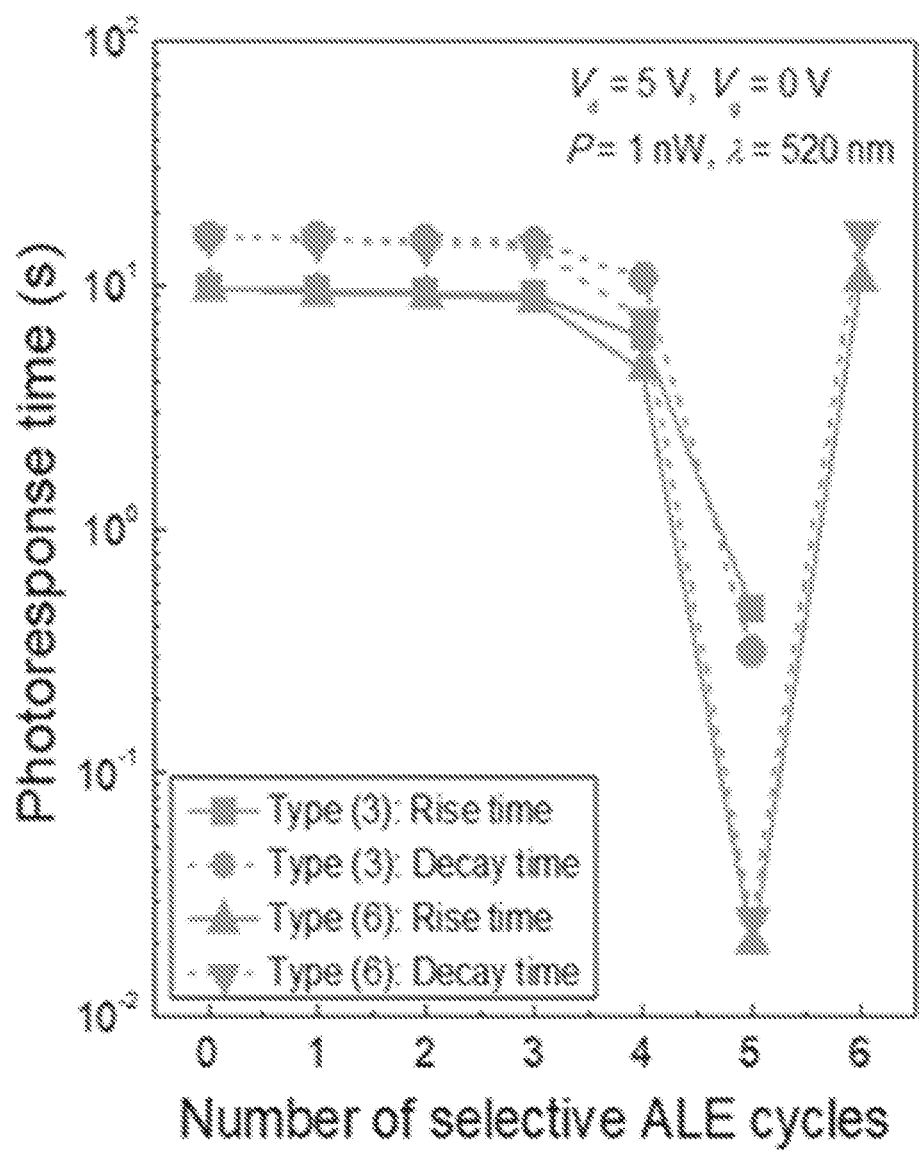

FIGS. 16A and 16B illustrate results of analyzing photoresponsivity and photo-response time based on the number of cycles of a selective atomic layer etching process for a $MoS_2$ thin film composed of 6 molecular layers in structures of the third photoelectronic device and the sixth photoelectronic device.

Referring to FIGS. 16A and 16B, in a structure of the sixth photoelectronic device, the highest photoresponsivity and the fastest photo-response were measured when the number of times of the atomic layer etching processes reached 5. That is, when, in the $MoS_2$ thin film channel, a region having the smaller number of the molecular layers is composed of a single molecular layer, the film exhibits the highest photoresponsivity and the fastest photo-response characteristics.

Figure 17A:
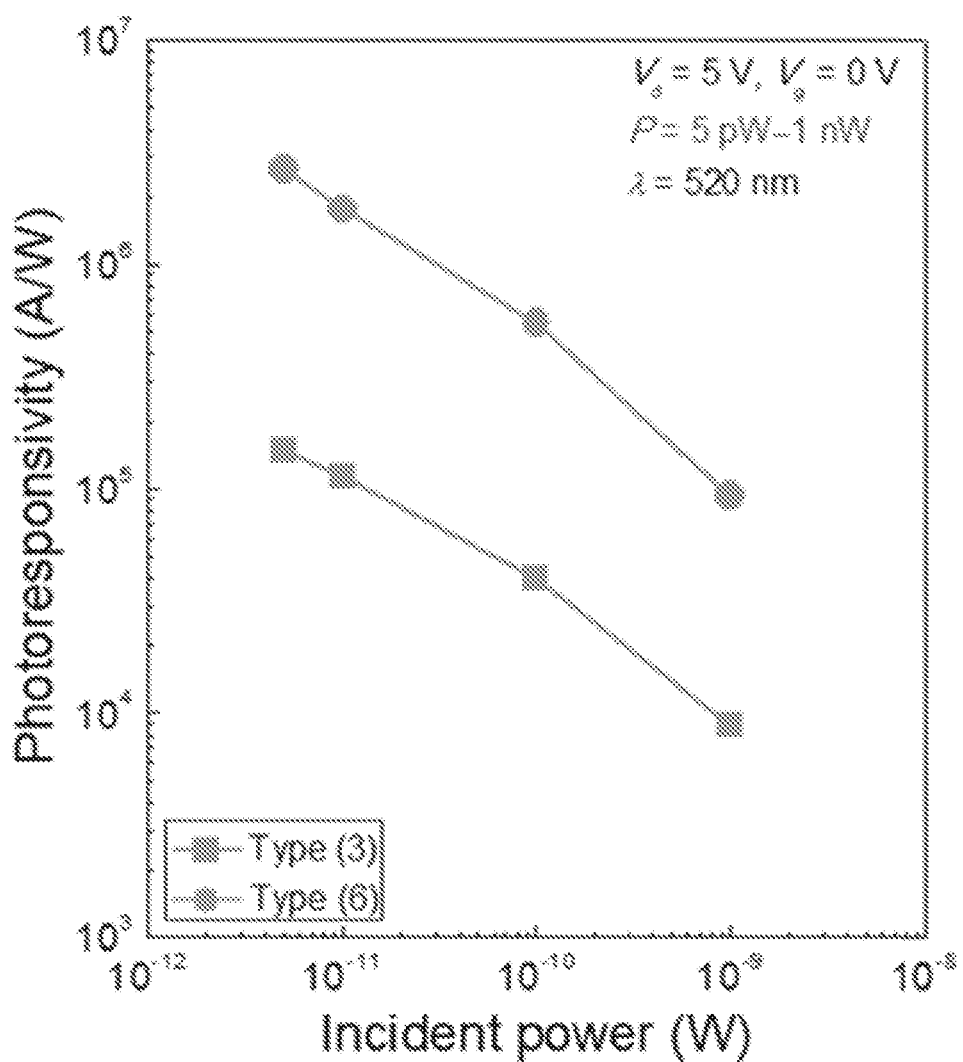
FIGS. 17A and 17B illustrate graphs of change in photoresponsivity and photo-response time based on power of incident light measured for the third and sixth photoelectronic devices.
Figure 17B:
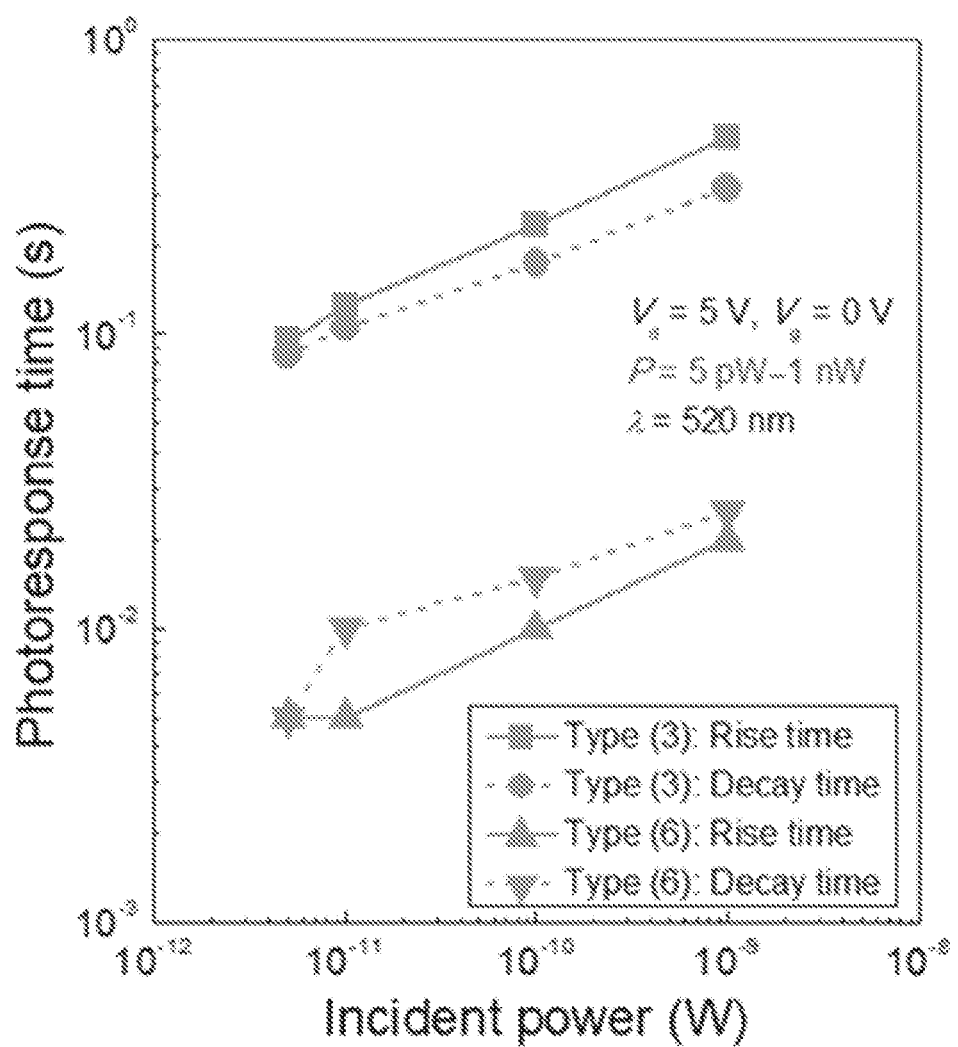

FIGS. 17A and 17B illustrate graphs of change in photoresponsivity and photo-response time based on power of incident light measured for the third and sixth photoelectronic devices.

Referring to FIGS. 17A and 17B, as the power of the incident laser light of 520 nm wavelength decreases, the photoresponsivity of each of the third and sixth photoelectronic devices increases, and the photo-response time thereof decreases. This is because scattering between photo carriers is suppressed as the power of the incident light decreases.

In one example, the photoresponsivity of the third photoelectric device and the sixth photoelectronic device at the lowest power 5 pW of the incident light were $1.49 \times 10^5$ A/W and $2.67 \times 10^6$ A/W respectively. The photo-response times (rise time/decay time) thereof were 95 ms/85 ms and 5 ms/5 ms respectively. Thus, the photoresponsivity thereof are very high and the photo-response thereof are very fast.

Figure 18A:
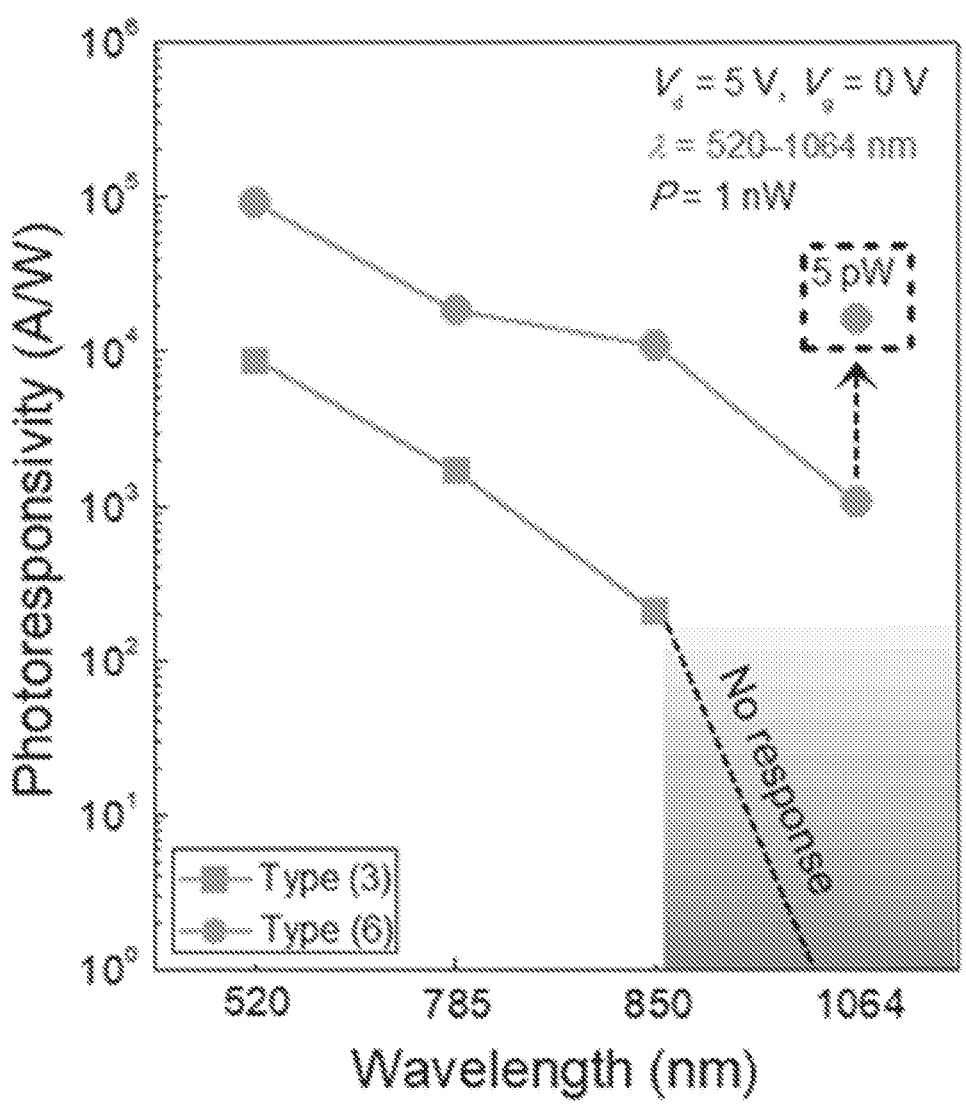
FIGS. 18A and 18B illustrate a graph of change in photoresponsivity and photo-response time based on a wavelength of incident light measured for the third and sixth photoelectronic devices.
Figure 18B:
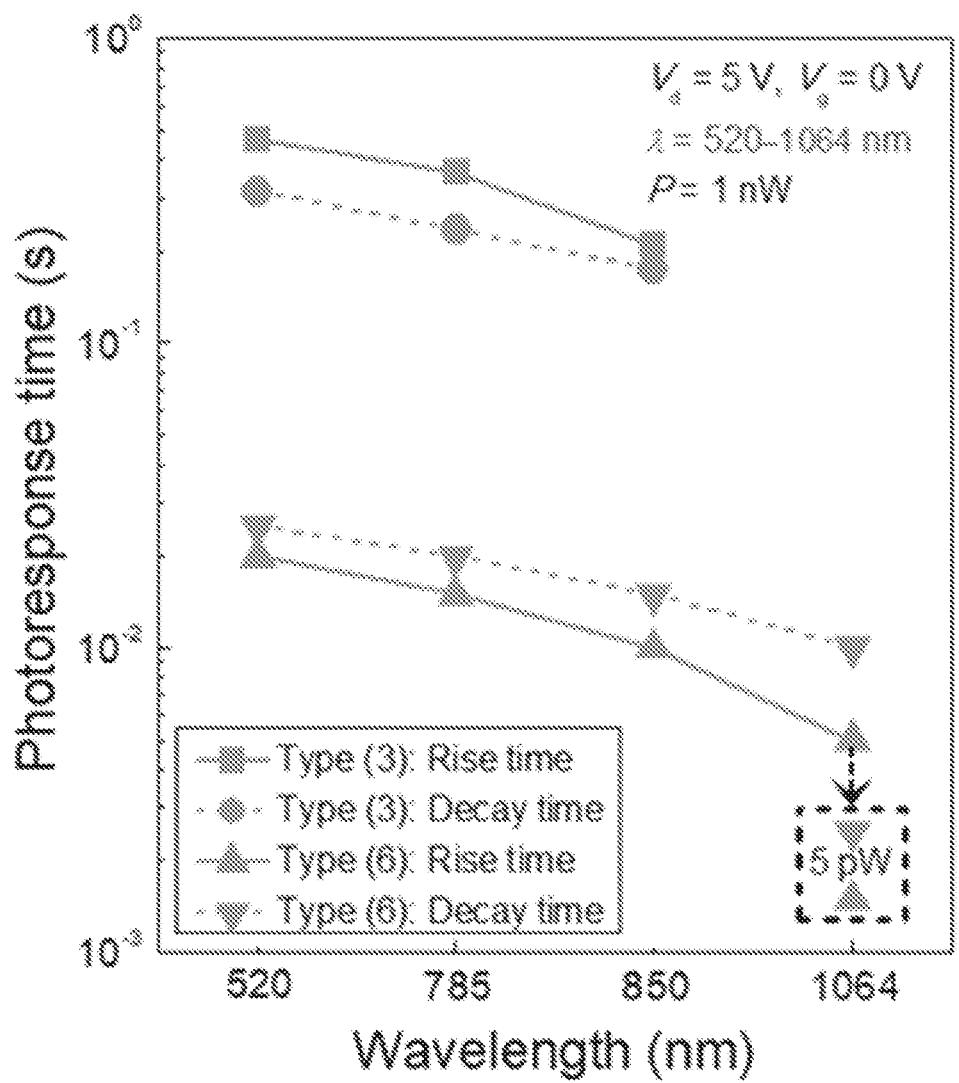

FIGS. 18A and 18B illustrate a graph of change in photoresponsivity and photo-response time based on a wavelength of incident light measured for the third and sixth photoelectronic devices.

Referring to FIGS. 18A and 18B, the third photoelectric device and the sixth photoelectronic device have the decrease in photoresponsivity as the wavelength of the incident light increases from that of visible light to that of near infrared region. In particular, the third photoelectronic device exhibited photoresponsivity of $2.05 \times 10^2$ A/W to light at 850 nm wavelength but did not respond to light at 1064 nm wavelength. In contrast, the sixth photoelectronic device exhibited a photoresponsivity of $1.08 \times 10^4$ A/W to 850 nm wavelength light and exhibited the photoresponsivity of $1.07 \times 10^3$ A/W to the light at 1064 nm wavelength.

In one example, the third photoelectronic device and the sixth photoelectronic device have gradual decrease of the photo-response time as the wavelength of incident light increases from that of visible light to that of near infrared region. Particularly, when the incident light wavelength was 1064 nm, the rising time/decay time of the sixth photoelectronic device was found to be the smallest (5 ms/10 ms). This is because the photo carriers detected in the near infrared region depend on not a band to band transition but the interlayer gap.

In addition, in FIGS. 18A and 18B, as the power of the incident light is lowered to 5 pW at 1064 nm wavelength, both of the photoresponsivity and the photo-response time of the sixth photoelectronic device may be further improved. Thus, it may be seen that in the sixth photoelectronic device, the carrier transport resulting from many interlayer gaps about 0.49 eV present in the multiple heterojunctions enables fast electron-hole separation and recombination.

Figure 19A:
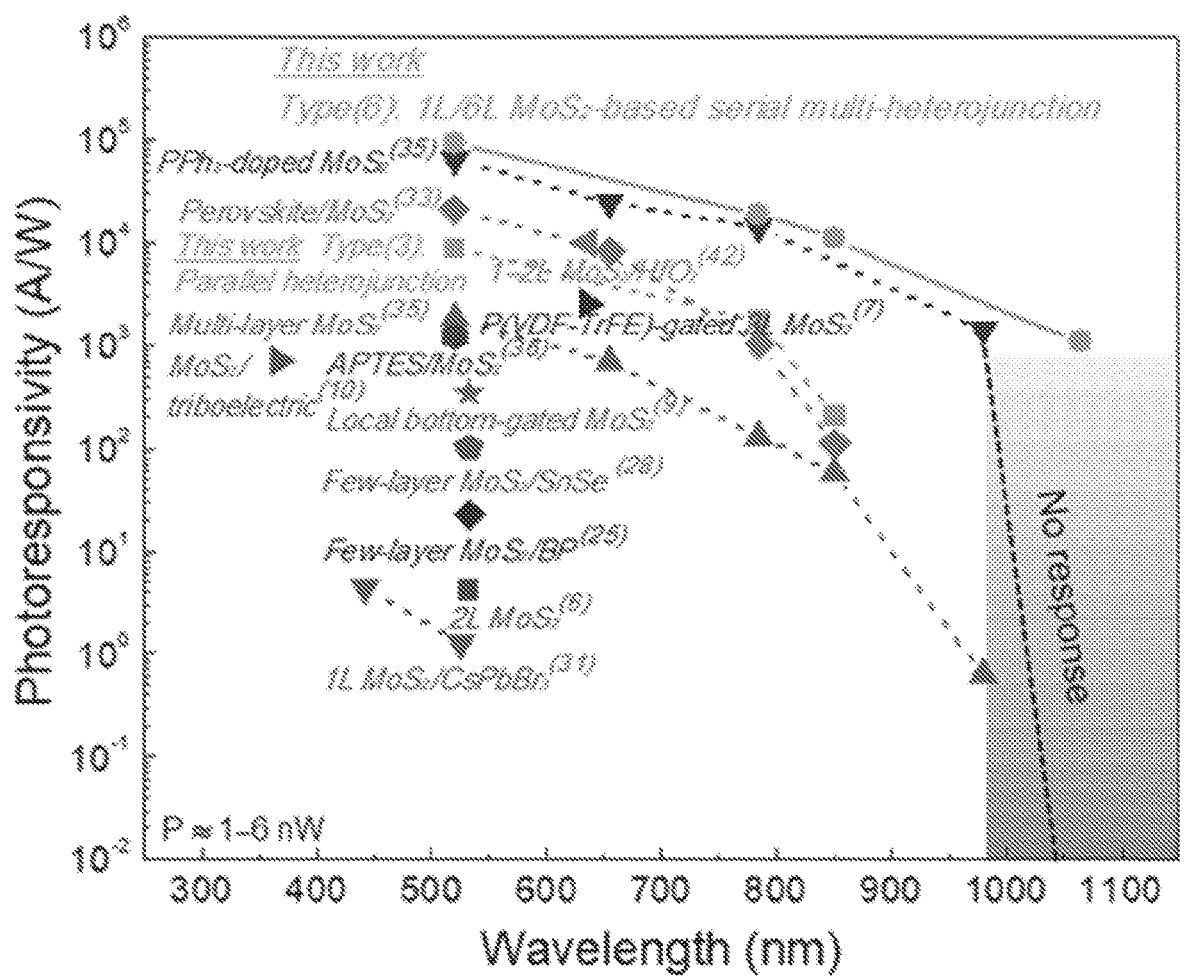
FIGS. 19A and 19B illustrate a comparing result between characteristics of the sixth photoelectronic device and a recently reported MoS$_2$-based photodetector device.
Figure 19B:
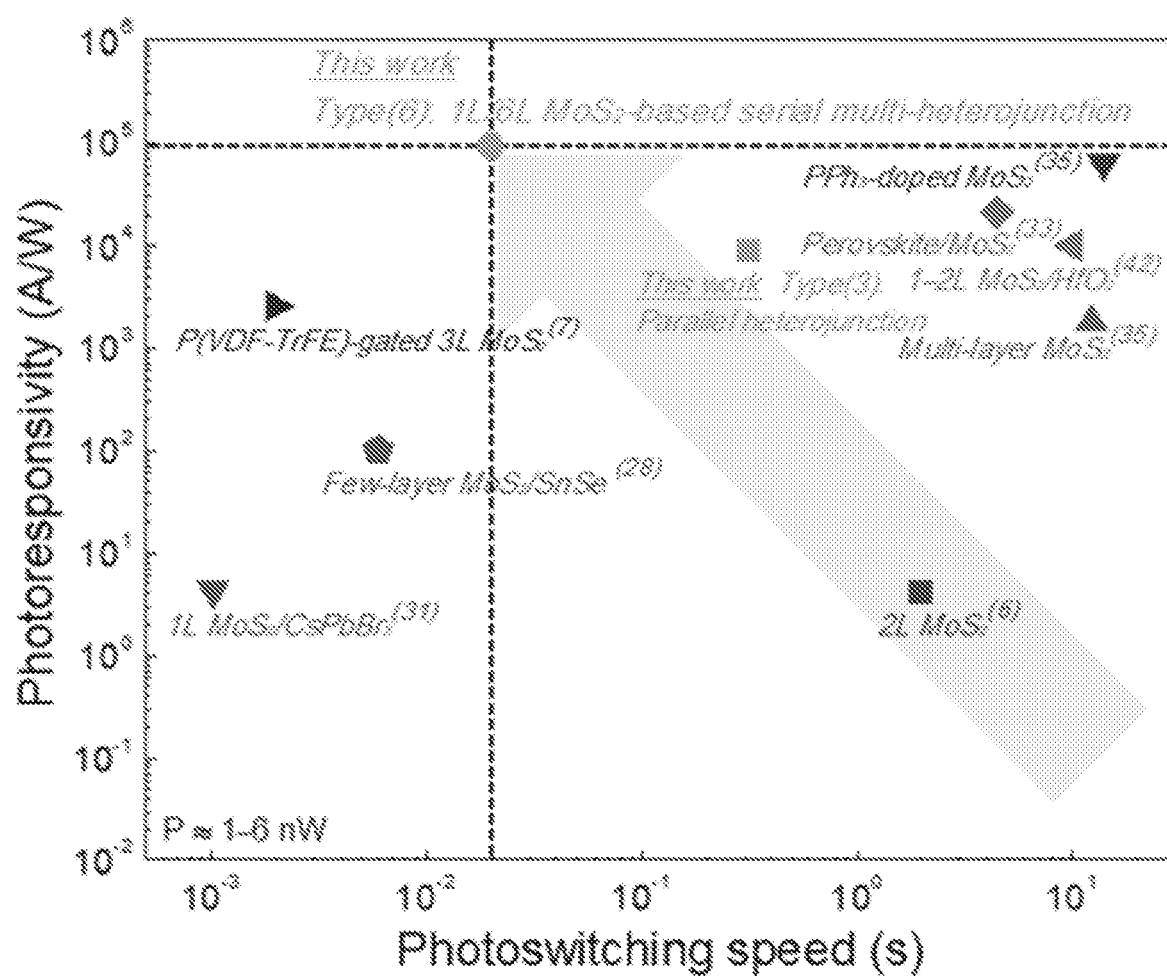

FIGS. 19A and 19B illustrate a comparing result between characteristics of the sixth photoelectronic device and a recently reported $MoS_2$-based photodetector device.

Referring to FIGS. 19A and 19B, it may be seen that the sixth photoelectronic device according to the present disclosure exhibited a remarkably improved effect compared to recently reported $MoS_2$-based photosensitive devices.

While the foregoing has been described with reference to the preferred embodiments of the present disclosure, it will be appreciated that those skilled in the art may have modifications and variations of the present disclosure without departing from the spirit and region of the present disclosure set forth in the claims below.

What is claimed is:

1. A photoelectronic device comprising:
   a substrate;
   a first electrode and a second electrode disposed on the substrate and spaced apart from each other in a first direction; and
   a transition metal dichalcogenide thin film comprising first regions and second regions,
   wherein each first region includes M+N transition metal dichalcogenide molecular layers and extends along the first direction, each of M and N being a positive integer of 1 or greater,
   wherein each second region includes N transition metal dichalcogenide molecular layers extending from lower N transition metal dichalcogenide molecular layers of the first region, wherein each second region extends along the first direction and is adjacent to each first region, and
   wherein both end regions in the first direction of the transition metal dichalcogenide thin film comprising the first and second regions are electrically connected to the first electrode and the second electrode, respectively.

2. The photoelectronic device of claim 1, wherein each of the first and second regions is arranged alternately with each other.

3. The photoelectronic device of claim 2, wherein each of the second regions has a single molecular layer, and each of the first regions has two or more molecular layers.

4. The photoelectronic device of claim 2, wherein a width of each of the first and second regions is independently in a range of 1 nm to 100 μm.

5. The photoelectronic device of claim 2, wherein the transition metal dichalcogenide thin film further includes at least 10 heterojunctions respectively formed between each first region and each second region.

6. The photoelectronic device of claim 1, wherein the transition metal dichalcogenide thin film further comprises third regions, each third region having L transition metal dichalcogenide molecular layers, L being smaller than M+N and larger than N, and L being a positive integer.

7. A photodiode comprising:
   a substrate;
   a first electrode and a second electrode disposed on the substrate and spaced apart from each other in a first direction; and
   a transition metal dichalcogenide thin film comprising first regions and second regions,
   wherein each first region includes M+N transition metal dichalcogenide molecular layers and extends along the first direction, each of M and N being a positive integer of 1 or greater,
   wherein each second region includes N transition metal dichalcogenide molecular layers extending from lower N transition metal dichalcogenide molecular layers of each first region,
   wherein each second region extends along the first direction and is adjacent to each first region,
   wherein both end regions in the first direction of the transition metal dichalcogenide thin film comprising the first and second regions are electrically connected to the first electrode and the second electrode, respectively, and
   wherein a heterojunction is formed between each first region and each second region.

* * * * *